(12) United States Patent
Seo et al.

(10) Patent No.: US 9,680,065 B2
(45) Date of Patent: Jun. 13, 2017

(54) LIGHT EMITTING DEVICE AND LIGHT EMITTING DEVICE PACKAGE INCLUDING THE SAME

(71) Applicant: LG INNOTEK CO., LTD., Seoul (KR)

(72) Inventors: Jae Won Seo, Seoul (KR); Sang Youl Lee, Seoul (KR); Sung Ho Jung, Seoul (KR); Jin Kyung Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/077,161

(22) Filed: Mar. 22, 2016

(65) Prior Publication Data
US 2016/0284941 A1 Sep. 29, 2016

(30) Foreign Application Priority Data

Mar. 26, 2015 (KR) .................. 10-2015-0042660

(51) Int. Cl.
| | |
|---|---|
| *H01L 33/00* | (2010.01) |
| *H01L 33/46* | (2010.01) |
| *H01L 33/40* | (2010.01) |
| *H01L 33/42* | (2010.01) |
| *H01L 33/56* | (2010.01) |
| *H01L 33/62* | (2010.01) |

(52) U.S. Cl.
CPC ............ *H01L 33/46* (2013.01); *H01L 33/405* (2013.01); *H01L 33/42* (2013.01); *H01L 33/56* (2013.01); *H01L 33/62* (2013.01); *H01L 33/0079* (2013.01)

(58) Field of Classification Search
CPC ....... H01L 33/405; H01L 33/44; H01L 33/60; H01L 33/42; H01L 2924/181; H01L 33/08

USPC .......................................................... 257/98
See application file for complete search history.

(56) References Cited

U.S. PATENT DOCUMENTS

| 2005/0104080 A1* | 5/2005 | Ichihara ................. H01L 33/32 257/98 |
| 2012/0241720 A1 | 9/2012 | Totani et al. |

(Continued)

FOREIGN PATENT DOCUMENTS

| EP | 2 835 885 | 2/2015 |
| JP | 2006-128727 A | 5/2006 |
| TW | 2015 17301 | 5/2015 |

OTHER PUBLICATIONS

European Search Report issued in Application EP 16 15 8880.1 dated Aug. 17, 2016.

*Primary Examiner* — Theresa T Doan

(74) *Attorney, Agent, or Firm* — Ked & Associates, LLP

(57) ABSTRACT

A light emitting device and a light emitting device package are provided. The light emitting device may include a substrate, a light emitting structure provided under the substrate and including a first conductive semiconductor layer, an active layer, and a second conductive semiconductor layer, a first insulating layer configured to expose the second conductive semiconductor layer and provided on a lower edge of the light emitting structure, a first light permeable electrode layer provided under the second conductive semiconductor layer exposed by the first insulating layer, a second light permeable electrode layer provided under the first insulating layer and the first light permeable electrode layer, and a reflective layer provided under the second light permeable electrode layer.

20 Claims, 21 Drawing Sheets

(56) References Cited

U.S. PATENT DOCUMENTS

| | | | |
|---|---|---|---|
| 2013/0292730 A1* | 11/2013 | Kim | H01L 33/20 257/98 |
| 2014/0034981 A1 | 2/2014 | Hung et al. | |
| 2014/0077242 A1* | 3/2014 | Lee | H01L 33/505 257/98 |
| 2014/0159083 A1 | 6/2014 | Han et al. | |
| 2015/0108492 A1 | 4/2015 | Kuo | |

* cited by examiner

LIGHT EMITTING DEVICE AND LIGHT EMITTING DEVICE PACKAGE INCLUDING THE SAME

CROSS-REFERENCE TO RELATED APPLICATION

This application claims priority under 35 U.S.C. §119 to Korea Application No. 10-2015-0042660, filed in Korea on Mar. 26, 2015, whose entire disclosure is incorporated herein by reference.

BACKGROUND

1. Field

Embodiments relate to a light emitting device and a light emitting device package including the same.

2. Background

A light emitting diode (LED) is a type of a semiconductor device that is used as a light source using characteristics of a compound semiconductor and exchanges signals by converting electricity into infrared light or light. Group III-V nitride semiconductors have been highlighted as core elements of light emitting devices, such as, e.g., LEDs and laser diodes (LDs), due to their physical and chemical characteristics. Such LEDs have excellent eco-friendly properties because LEDs do not include environmentally hazardous materials, for example, mercury (Hg), used in general lighting apparatuses, such as, e.g., light bulbs and fluorescent lamps, and are replacing other light sources due to characteristics, such as, for example, long lifetimes and low power consumption. In a light emitting device package having a flip chip bonding structure, a width of a reflective layer provided under a p-GaN layer for reflecting light emitted from an active layer may be small, and thus, efficiency of luminous flux may not be significantly improved.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
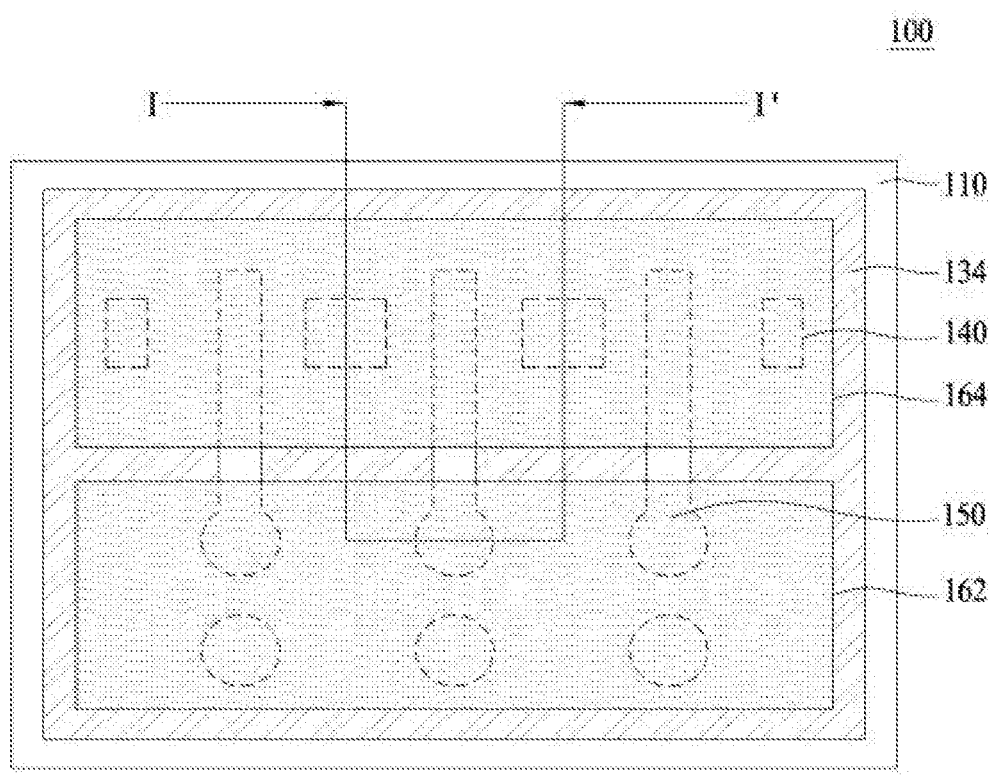
FIG. 1 is a plan view illustrating a light emitting device according to an embodiment.
Figure 1:
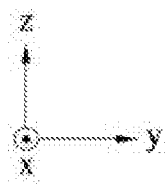
Figure 2:
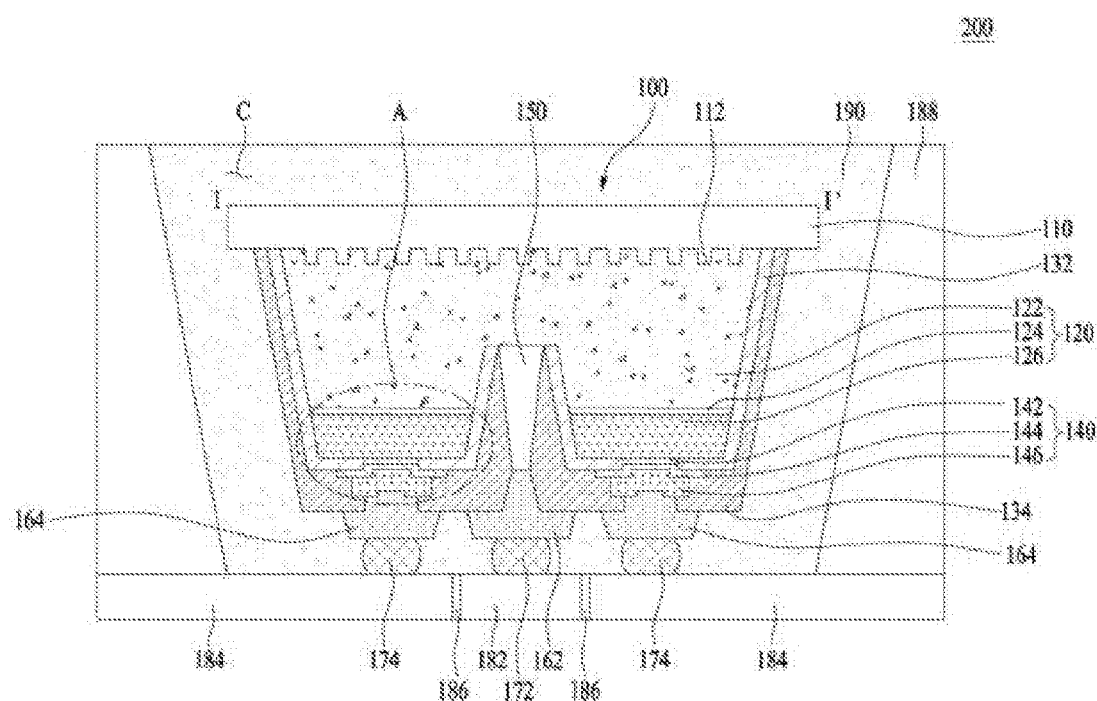
FIG. 2 is a cross-sectional view illustrating a light emitting device package according to an embodiment.
Figure 3:
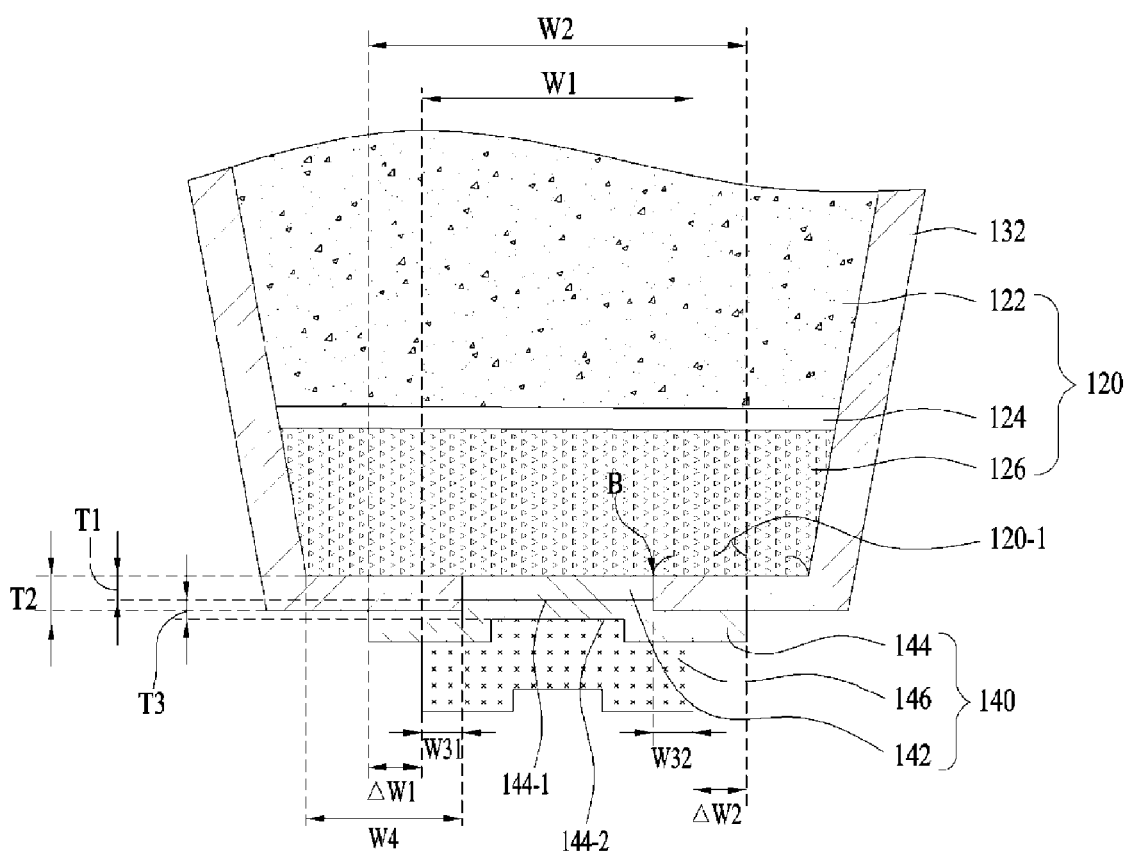
FIG. 3 is an enlarged cross-sectional view illustrating a portion 'A' shown in FIG. 2.

FIG. 1 is a plan view illustrating a light emitting device 100 according to an embodiment. FIG. 2 is a cross-sectional view illustrating a light emitting device package 200 according to an embodiment. FIG. 3 is an enlarged cross-sectional view illustrating a portion 'A' shown in FIG. 2. The light emitting device 100 in the light emitting device package 200 shown in FIG. 2 may correspond to a cross-sectional view taken along line I-I' of the light emitting device 100 shown in FIG. 1. For convenience of description, a second insulating layer 134 and a second bonding pad 164 shown in FIG. 1 have been omitted in FIG. 3.

Referring to FIGS. 1 and 2, the light emitting device 100 according to the embodiment may include a substrate 110, a light emitting structure 120, a first insulating layer 132, a first electrode 150, and a second electrode 140. The light emitting structure 120 may be provided under the substrate 110. The substrate 110 may include a conductive material or non-conductive material. For example, the substrate 110 may include at least one of sapphire ($Al_2O_3$), GaN, SiC, ZnO, GaP, InP, $Ga_2O_3$, GaAs, or Si. Although the substrate 110 may be, for example, a patterned sapphire substrate (PSS) having a pattern 112 to assist light emitted from an active layer 124 exit from the light emitting device 100, the embodiment is not limited thereto.

To improve a difference between coefficients of thermal expansion of the substrate 110 and the light emitting structure 120 and lattice mismatching, a buffer layer or transition layer may be further provided between the substrate 110 and the light emitting structure 120. The buffer layer may include, for example, at least one material selected from a group consisting of Al, In, N, and Ga, but is not limited thereto. Further, the buffer layer may have a single layer or multilayer structure.

The light emitting structure 120 may include a first conductive semiconductor layer 122, the active layer 124, and a second conductive semiconductor layer 126, which may be provided sequentially under the substrate 110. The first conductive semiconductor layer 122 may be implemented as a compound semiconductor included in Group III-V, Group II-VI, or the like doped with a first conductive dopant. When the first conductive semiconductor layer 122 is an n-type semiconductor layer, the first conductive dopant may be an n-type dopant and may include Si, Ge, Sn, Se, or Te, but is not limited thereto. For example, the first conductive semiconductor layer 122 may include a semiconductor material having a compositional formula $Al_xIn_yGa_{(1-x-y)}N$ ($0 \leq x \leq 1$, $0 \leq y \leq 1$, $0 \leq x+y \leq 1$). The first conductive semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be provided between the first conductive semiconductor layer 122 and the second conductive semiconductor layer 126 and may be a layer in which electrons or holes injected through the first conductive semiconductor layer 122 meet holes or electrons injected through the second conductive semiconductor layer 126 to emit light having an energy determined by an inherent energy band of a material forming the active layer 124. The active layer 124 may be formed with at least one of a single well structure, a multi well structure, a single quantum well structure, a multi quantum well (MQW) structure, a quantum-wire structure, or a quantum-dot structure. A well layer/barrier layer of the active layer 124 may be formed with one or more pair structures such as an InGaN/GaN structure, an InGaN/InGaN structure, a GaN/AlGaN structure, an InAlGaN/GaN structure, a GaAs(InGaAs)/AlGaAs structure, and a GaP(InGaP)/AlGaP structure, but is not limited thereto. The well layer may be formed of a material having a bandgap energy lower than the bandgap energy of the barrier layer.

A conductive clad layer may be formed above and/or under the active layer 124. The conductive clad layer may be formed of a semiconductor having a bandgap energy higher than the bandgap energy of the barrier layer of the active layer 124. For example, the conductive clad layer may include a GaN structure, an AlGaN structure, an InAlGaN structure, or a superlattice structure. Further, the conductive clad layer may be doped to be n-type or p-type.

The second conductive semiconductor layer 126 may be provided under the active layer 124 and may be formed of a compound semiconductor. The second conductive semiconductor layer 126 may be implemented as a compound semiconductor included in Group III-V or Group II-VI For example, the second conductive semiconductor layer 126 may include a semiconductor material having an empirical formula $In_xAl_yGa_{(1-x-y)}N$ ($0 \le x \le 1$, $0 \le y \le 1$, $0 \le x+y \le 1$). The second conductive semiconductor layer 126 may be doped with a second conductive dopant. When the second conductive semiconductor layer 126 is a p-type semiconductor layer, the second conductive dopant may be a p-type dopant and may include Mg, Zn, Ca, Sr, Ba, etc.

The first conductive semiconductor layer 122 may be an n-type semiconductor layer, and the second conductive semiconductor layer 126 may a p-type semiconductor layer. Alternatively, the first conductive semiconductor layer 122 may be a p-type semiconductor layer, and the second conductive semiconductor layer 126 may be an n-type semiconductor layer. The light emitting structure 120 may be any one structure of an n-p junction structure, a p-n junction structure, an n-p-n junction structure, and a p-n-p junction structure.

Since the light emitting device package 200 shown in FIG. 2 has a flip chip bonding structure, light emitted from the active layer 124 may exit through the substrate 110 and the first conductive semiconductor layer 122. The substrate 110 and the first conductive semiconductor layer 122 may be a material having light permeability or light transmissibility, and the second conductive semiconductor layer 126 and the second electrode 140 may be a material either having light permeability or light impermeability.

The first electrode 150 may be provided under the first conductive semiconductor layer 122 exposed at a through-hole TH that passes through the second conductive semiconductor layer 126 and the active layer 124 to expose the first conductive semiconductor layer 122 and may be electrically connected to the first conductive semiconductor layer 122. The through-hole TH may be described in detail with reference to FIG. 4B. In FIG. 1, the first electrode 150 covered by the first bonding pad 162 is illustrated with dotted lines, and the first electrode 150 and the second electrode 140 covered by the second bonding pad 164 are also illustrated with dotted lines.

The first electrode 150 may include an ohmic-contact material serving an ohmic function and thus may not need an additional ohmic layer to be provided, or an additional ohmic layer may also be provided between the first electrode 150 and the first conductive semiconductor layer 122. The first electrode 150 may not absorb light emitted from the active layer 124 and reflect or transmit the light, and may be formed of any material which may be grown in a good quality on the first conductive semiconductor layer 122. For example, the first electrode 150 may be formed of a metal and formed of Ag, Ni, Ti, Al, Rh, Pd, Ir, Ru, Mg, Zn, Pt, Au, Hf, Cr, or a selective combination thereof. For example, the first electrode 150 may be formed of Cr/Ni/Au, but the embodiment is not limited thereto.

The first insulating layer 132 may expose the bottom of the second conductive semiconductor layer 126 and may be provided on an inner sidewall, an outer sidewall, and a lower edge 120-1 of the light emitting structure 120. That is, the first insulating layer 132 may be provided to extend from the lower edge 120-1 of the light emitting structure 120 to the inner sidewall or a side of the light emitting structure 120 exposed at the through-hole TH. The first insulating layer 132 may be provided on sides of the second conductive semiconductor layer 126, of the active layer 124, and of the first conductive semiconductor layer 122 in an outer sidewall shown in FIG. 4B. The outer sidewall may be a portion SP shown in FIG. 4B. The first insulating layer 132 may perform a function of a current blocking layer (CBL). Further, as described with reference to FIGS. 4C to 4F below, the first insulating layer 132 may protect the light emitting structure 120. The first insulating layer 132 may include at least one of $SiO_2$, $TiO_2$, $ZrO_2$, $Si_3N_4$, $Al_2O_3$, or $MgF_2$.

The second electrode 140 may be provided under the light emitting structure 120 and may be electrically connected to the second conductive semiconductor layer 126. The second electrode 140 may include a plurality of light permeable electrode layers or light transmissible electrode layers and reflective layers 146. The plurality of light permeable electrode layers may be provided under the exposed second conductive semiconductor layer 126. The light permeable electrode layers may overlap each other in a thickness direction, for example, x-axis direction, of the light emitting structure 120. Also, the light permeable electrode layers may overlap with the exposed second conductive semiconductor layer 126. For example, the plurality of light permeable electrode layers may include first and second light permeable electrode layers 142 and 144, but the embodiment is not limited thereto. That is, the number of the plurality of light permeable electrode layers may be two or more.

The first light permeable electrode layer 142 may be provided under the second conductive semiconductor layer 126 exposed by the first insulating layer 132 and may perform a function of an ohmic layer. A first thickness T1 of the first light permeable electrode layer 142 may be equal to or less than a second thickness T2 of the first insulating layer 132, but the embodiment is not limited thereto. For example, the second thickness T2 may be several hundreds of nanometers, and the first thickness T1 may be several nanometers, but the embodiment is not limited thereto.

The second light permeable electrode layer 144 may be provided under each of first insulating layer 132 and the first light permeable electrode layer 142. The second light permeable electrode layer 144 may include a first surface 144-1 and a second surface 144-2. The first surface 144-1 may be a surface facing the light emitting structure 120 and may have a cross-sectional shape of a step. That is, one part of the first surface 144-1 may be in contact with the first light permeable electrode layer 142, and another part of the first surface 144-1 may be in contact with the first insulating layer 132, but the embodiment is not limited thereto. The second surface 144-2 may be a surface opposite the first surface 144-1 and may have a cross-sectional shape of a step. Further, the entire reflective layer 146 may be provided under the second surface 144-2.

The first and second light permeable electrode layers 142 and 144 may include materials which may be substantially the same or different from each other, but the embodiment is not limited thereto. Each of the first and second light permeable electrode layers 142 and 144 may also be formed of transparent conductive oxide (TCO). For example, each of the first and second light permeable electrode layers 142 and 144 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, or Ni/IrOx/Au/ITO but is not limited to the above materials.

The reflective layer 146 may be provided under the plurality of light permeable electrode layers. For example, referring to FIGS. 2 and 3, the reflective layer 146 may be provided under the second light permeable electrode layer 144. Further, the reflective layer 146 may be separated from the first insulating layer 132 by at least one of the plurality of light permeable electrode layers. For example, referring to FIGS. 2 and 3, the reflective layer 146 may be separated from the first insulating layer 132 by the second light permeable electrode layer 144. As described above, the second light permeable electrode layer 144 may perform a function of separating the first insulating layer 132 from the reflective layer 146. Accordingly, as long as a third thickness T3 of the second light permeable electrode layer 144 is sufficient to separate the first insulating layer 132 from the reflective layer 146, the thickness T3 may not need to be large. The reflective layer 146 may be formed with a metal layer formed of aluminum (Al), gold (Au), silver (Ag), nickel (Ni), platinum (Pt), rhodium (Rh), titanium (Ti), chrome (Cr), or an alloy including Al, Ag, Pt, or Rh. For example, the reflective layer 146 may be formed of Ag/Ni/Ti, but the embodiment is not limited thereto.

The second light permeable electrode layer 144 may be provided to cover a boundary B between the first light permeable electrode layer 142 and the first insulating layer 132. A first width W1 of the reflective layer 146 may be equal to or less than a second width W2 of the second light permeable electrode layer 144 in a first direction perpendicular to a thickness direction, for example, x-axis direction, of the light emitting structure 120. Accordingly, a width difference value (W2−W1, that is, ΔW1+ΔW2) between the first width W1 and the second width W2 may be zero or more. As described above, when the first surface 144-1 of the second light permeable electrode layer 144 covers the boundary B and the second width W2 is large, the first width W1 of the reflective layer 146 may be increased, and thus, an amount of light reflected may be increased.

When the first insulating layer 132 includes $SiO_2$, the reflective layer 146 includes silver (Ag), and the first insulating layer 132 is provided not to be separated from the reflective layer 146 and, instead, to be in contact therewith, the first insulating layer 132 and the reflective layer 146 may become delaminated from each other. However, in the light emitting device 100 according to the embodiment, the second light permeable electrode layer 144 may be provided between the first insulating layer 132 and the reflective layer 146, and thus, the first insulating layer 132 and the reflective layer 146 may be separated from each other so a delamination concern may be eliminated.

At least a part or portion of the first insulating layer 132, at least a part or portion of the second light permeable electrode layer 144, and at least a part or portion of the reflective layer 146 may be provided to overlap each other by third widths W31 and W32 in a thickness direction, for example, x-axis direction, of the light emitting structure 120. As a fourth width W4 of the first insulating layer 132 provided on the lower edge 120-1 of the light emitting structure 120 increases, the third width W31 may increase. When the fourth width W4 is smaller than 10 μm, manufacturing the first insulating layer 132 may be difficult when a process margin may be considered. When the fourth width W4 is greater than 40 μm, a forward operating voltage of the light emitting device 100 may be increased, and luminous flux may also be decreased. Accordingly, the fourth width W4 may be in a range of about 10 μm to 40 μm, for example, 10 μm, but the embodiment is not limited thereto. In this case, the third width W31 may be 5 μm, but the embodiment is not limited thereto.

The light emitting device package 200 shown in FIG. 2 may include a light emitting device 100, a second insulating layer 134, first and second bonding pads 162 and 164, first and second soldering portions 172 and 174, first and second lead frames 182 and 184, an insulator 186, a package body 188, and a molding member 190. The first bonding pad 162 may pass through the second conductive semiconductor layer 126 and the active layer 124, may be buried in the through-hole TH that exposes the first conductive semiconductor layer 122, and may be electrically connected to the first conductive semiconductor layer 122 by the first electrode 150. Or, as shown in FIG. 2, the first bonding pad 162 may be electrically connected to the first conductive semiconductor layer 122 by the first electrode 150, without passing through the second conductive semiconductor layer 126 and the active layer 124 and without being buried in the through-hole TH that exposes the first conductive semiconductor layer 122.

The second bonding pad 164 may be electrically connected to the second conductive semiconductor layer 126 by the second electrode 140. The second bonding pad 164 and the first bonding pad 162 may be separated from each other in a direction that intersects a thickness direction of the light emitting structure 120. For example, the second bonding pad 164 and the first bonding pad 162 may be separated from each other in a direction perpendicular to a thickness direction of the light emitting structure 120. In FIG. 2, although the second bonding pad 164 is illustrated as divided into two, referring to FIG. 1, the second bonding pad 164 may be one body.

Each of the first and second bonding pads 162 and 164 may include a metal material having electrical conductivity and may include a material substantially the same as or different from a material of each of the first and second electrodes 150 and 140. Each of the first and second bonding pads 162 and 164 may include at least one of Ti, Ni, Au, or Sn, but the embodiment is not limited thereto. For example, each of the first and second bonding pads 162, 164 may be formed of Ti/Ni/Au/Sn/Au.

The second insulating layer 134 may be provided between the first bonding pad 162 and the second electrode 140, and thus, may perform a function of electrically separating the second electrode 140 from the first bonding pad 162. That is, the second insulating layer 134 may also be provided between the first bonding pad 162 and the second light permeable electrode layer 144 and may also be provided between the first bonding pad 162 and the reflective layer 146. Further, the second insulating layer 134 may be provided between the second bonding pad 164 and the first electrode 150, and thus, may perform a function of electrically separating the first electrode 150 from the second bonding pad 164. The second insulating layer 134 may include at least one of $SiO_2$, $TiO_2$, $ZrO_2$, $Si_3N_4$, $Al_2O_3$, or $MgF_2$. The first and second insulating layers 132 and 134 may have a same material or different materials from each other.

The first soldering portion 172 may be provided between the first bonding pad 162 and the first lead frame 182, and thus, may serve to electrically connect the first bonding pad 162 to the first lead frame 182. The second soldering portion 174 may be provided between the second bonding pad 164 and the second lead frame 184 and may serve to electrically connect the second bonding pad 164 to the second lead frame 184. Each of the first and second soldering portions 172 and 174 may be solder paste or solder balls, but the embodiment is not limited thereto.

The above-described first soldering portion 172 may electrically connect the first conductive semiconductor layer 122 to the first lead frame 182 by the first bonding pad 162, the second soldering portion 174 may electrically connect the second conductive semiconductor layer 126 to the second lead frame 184 by the second bonding pad 164, and thus, a need for wires may be eliminated. However, according to another embodiment, the first and second conductive semiconductor layers 122 and 126 may be respectively connected to the first and second lead frames 182 and 184 using wires.

The first soldering portion 172 and the second soldering portion 174 may be omitted. In this case, the first bonding pad 162 may perform a function of the first soldering portion 172, and the second bonding pad 164 may perform a function of the second soldering portion 174. That is, when the first soldering portion 172 and the second soldering portion 174 are omitted, the first bonding pad 162 may be directly connected to the first lead frame 182, and the second bonding pad 164 may be directly connected to the second lead frame 184.

The first lead frame 182 may be electrically connected to the first bonding pad 162 by the first soldering portion 172, and the second lead frame 184 may be electrically connected to the second bonding pad 164 by the second soldering portion 174. The first and second lead frames 182 and 184 may be electrically separated from each other by the insulator 186. Each of the first and second lead frames 182 and 184 may be formed of a conductive material, for example, a metal, but the embodiment is not limited to those materials for each of the first and second lead frames 182 and 184.

The insulator 186 may be provided between the first and second lead frames 182 and 184 to electrically insulate the first lead frame 182 from the second lead frame 184. The insulator 186 may include at least one of $SiO_2$, $TiO_2$, $ZrO_2$, $Si_3N_4$, $Al_2O_3$, or $MgF_2$, but the embodiment is not limited thereto.

The package body 188 together with the first and second lead frames 182 and 184 may form a cavity C, but the embodiment is not limited thereto. According to another embodiment, the cavity C may be formed with the package body 188 only. Alternatively, a barrier wall may be provided on a planar upper surface of the package body 188, and the cavity may be defined by the barrier wall and the upper surface of the package body 188. The light emitting device 100 may be provided in the cavity C as shown in FIG. 2.

The package body 188 may be formed of silicone, a synthetic resin, or a metal. When the package body 188 is formed of a conductive material, for example, a metal material, the first and second lead frames 182 and 184 may be a part of the package body 188. Also, in this case, the first and second lead frames 182 and 184 forming the package body 188 may be electrically separated from each other by the insulator 186.

The molding member 190 may be provided to surround and protect the light emitting device 100 provided in the cavity C. The molding member 190 may be, for example, silicone (Si), and by including a phosphor or fluorescent substance, a wavelength of light emitted from the light emitting device 100 may be changed. The phosphor may include any one of wavelength converting phosphor materials of a YAG type, a TAG type, a silicate type, a sulfide type, and a nitride type capable of converting light generated from the light emitting device 100 into white light, but the embodiment is not limited to the type of the phosphor. One selected from $(Y, Tb, Lu, Sc, La, Gd, Sm)_3(Al, Ga, In, Si, Fe)_5(O, S)_{12}:Ce$ may be used as phosphors of YAG and TAG types, and one selected from $(Sr, Ba, Ca, Mg)_2SiO_4:(Eu, F, Cl)$ may be used as a phosphor of the silicate type.

One selected from $(Ca, Sr)S:Eu$ and $(Sr,Ca, Ba)(Al, Ga)_2S_4:Eu$ may be used as a phosphor of the sulfide type, at least one selected from phosphor components of $(Sr, Ca, Si, Al, O)N:Eu$ (e.g., $CaAlSiN_4:Eu$ or $\beta\text{-SiAlON:Eu}$) and $(Ca_x, M_y)(Si, Al)_{12}(O, N)_{16}$ of a Ca-αSiAlON:Eu type (here, M may be one material of Eu, Tb, Yb, or Er, and $0.05<(x+y)<0.3$, $0.02<x<0.27$ and $0.03<y<0.3$) may be used as a phosphor of the nitride type. As a red phosphor, a phosphor of the nitride type including N (e.g., $CaAlSiN_3:Eu$) may be used. Such a red phosphor of the nitride type may have a low risk of color change as well as excellent reliability with respect to external conditions including heat and moisture, when compared to the phosphors of the sulfide type.

A method of manufacturing the light emitting device package 200 shown in FIG. 2 may be described with reference to the accompanying drawings below. However, the light emitting device package 200 shown in FIG. 2 may obviously be manufactured by a different manufacturing method.

FIGS. 4A to 4H are process cross-sectional views illustrating a method of manufacturing the light emitting device package 200 shown in FIG. 2 according to an embodiment. FIGS. 5A to 5G are process plan views illustrating the method of manufacturing the light emitting device package 200 shown in FIG. 2 according to an embodiment. A lower layer obscured by an upper layer may be displayed using dotted lines in each drawing.

Figure 4A:
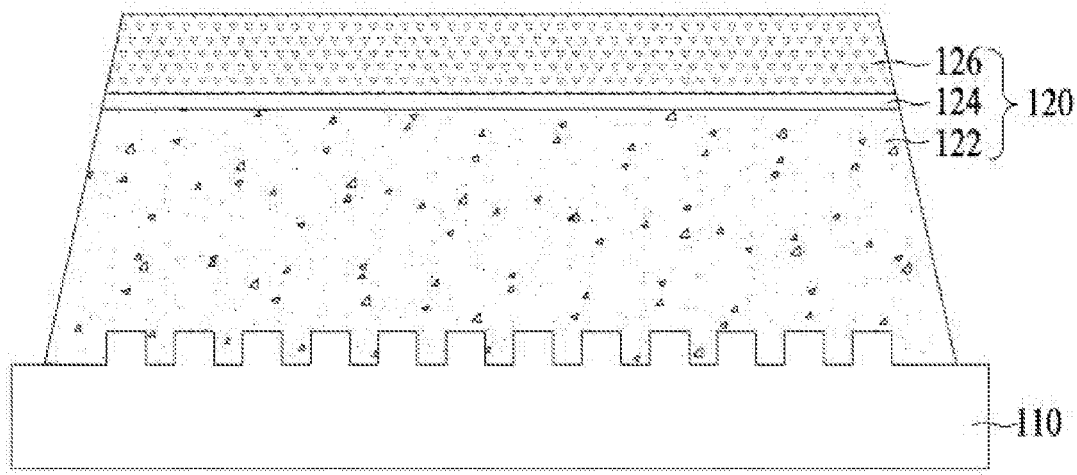
FIGS. 4A to 4H are process cross-sectional views illustrating a method of manufacturing the light emitting device package shown in FIG. 2 according to an embodiment.

Referring to FIG. 4A, a light emitting structure 120 may be formed on a substrate 110. The substrate 110 may include a conductive material or non-conductive material. For example, the substrate 110 may include at least one of sapphire ($Al_2O_3$), GaN, SiC, ZnO, GaP, InP, $Ga_2O_3$, GaAs, or Si. The light emitting structure 120 may be formed by sequentially stacking a first conductive semiconductor layer 122, an active layer 124, and a second conductive semiconductor layer 126 on the substrate 110.

The first conductive semiconductor layer 122 may be formed using a compound semiconductor included in Group III-V, Group II-VI, or the like doped with a first conductive dopant. When the first conductive semiconductor layer 122 is an n-type semiconductor layer, the first conductive dopant may be an n-type dopant and may include Si, Ge, Sn, Se, or Te but is not limited thereto. For example, the first conductive semiconductor layer 122 may be formed using a semiconductor material having a compositional formula $Al_xIn_yGa_{(1-x-y)}N$ ($0 \le x \le 1$, $0 \le y \le 1$, $0 \le x+y \le 1$). The first conductive semiconductor layer 122 may be formed using at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be formed with at least one of a single well structure, a multi well structure, a single quantum well structure, an MQW structure, a quantum-wire structure, or a quantum-dot structure. A well layer/barrier layer of the active layer 124 may be formed with one or more pair structures among InGaN/GaN, InGaN/InGaN, GaN/AlGaN, InAlGaN/GaN, GaAs(InGaAs)/AlGaAs, and GaP(InGaP)/AlGaP but is not limited thereto. The well layer may be formed of a material having a bandgap energy lower than the bandgap energy of the barrier layer.

A conductive clad layer may be formed on and/or under the active layer 124. The conductive clad layer may be formed of a semiconductor having a bandgap energy higher than the bandgap energy of the barrier layer of the active layer 124. For example, the conductive clad layer may include GaN, AlGaN, InAlGaN, superlattice structure, etc. Further, the conductive clad layer may be doped to be n-type or p-type.

The second conductive semiconductor layer 126 may be formed of a semiconductor compound and may be formed using a compound semiconductor included in, for example, Group III-V or Group II-VI. For example, the second conductive semiconductor layer 126 may include a semiconductor material having a compositional formula $In_xAl_yGa_{(1-x-y)}N$ ($0 \le x \le 1$, $0 \le y \le 1$, $0 \le x+y \le 1$). The second conductive semiconductor layer 126 may be doped with a second conductive dopant. When the second conductive semiconductor layer 126 is a p-type semiconductor layer, the second conductive dopant may be a p-type dopant and may include Mg, Zn, Ca, Sr, Ba, etc.

Figure 4B:
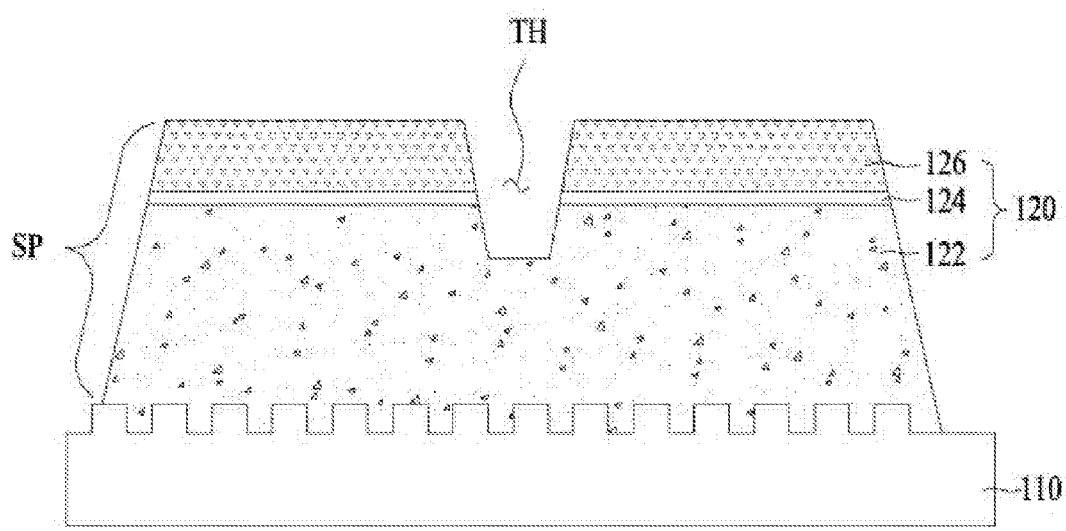
Figure 5A:
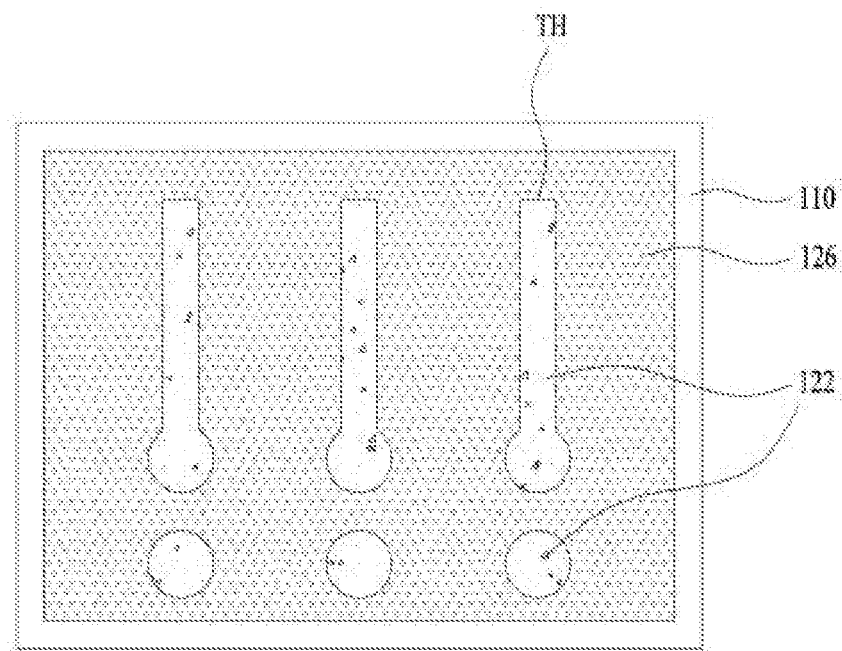
FIGS. 5A to 5G are process plan views illustrating the method of manufacturing the light emitting device package shown in FIG. 2 according to an embodiment.

Referring to FIGS. 4B and 5A, a through-hole TH that exposes the first conductive semiconductor layer 122 may be formed by mesa-etching parts of the second conductive semiconductor layer 126, the active layer 124, and the first conductive semiconductor layer 122 in the light emitting structure 120. As the through-hole TH is formed, sides of the second conductive semiconductor layer 126 and the active layer 124 of the light emitting structure 120 may be exposed at or by the through-hole TH.

Figure 4C:
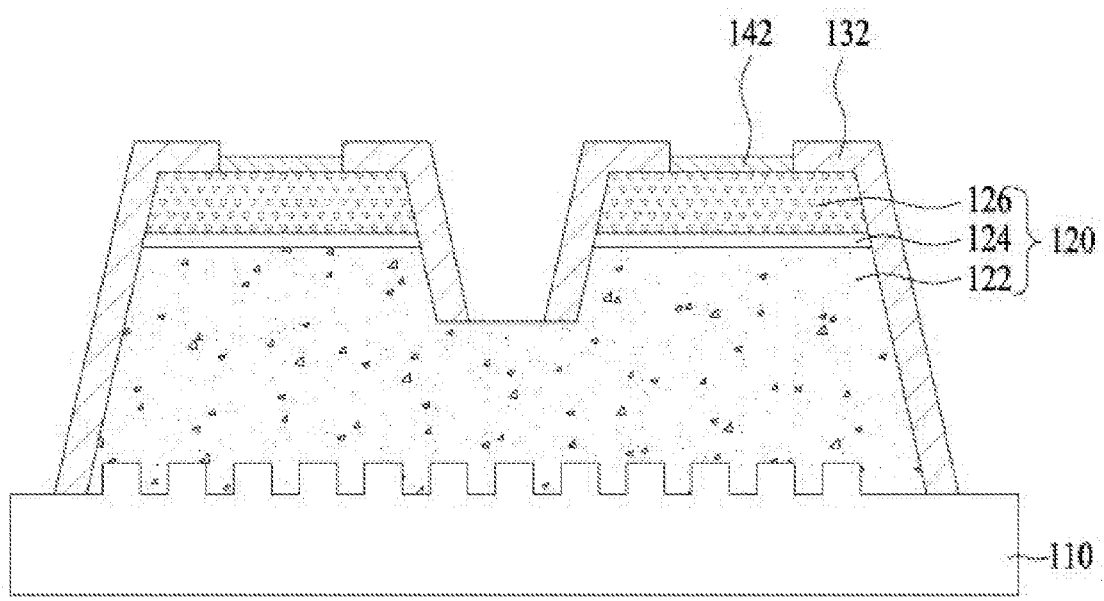
Figure 4D:
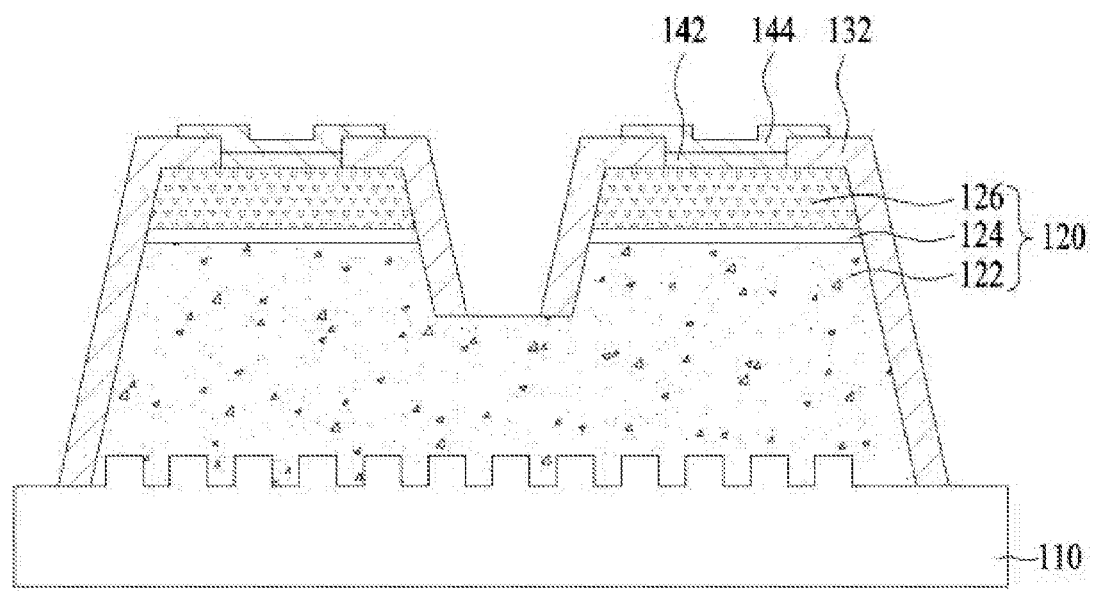
Figure 4E:
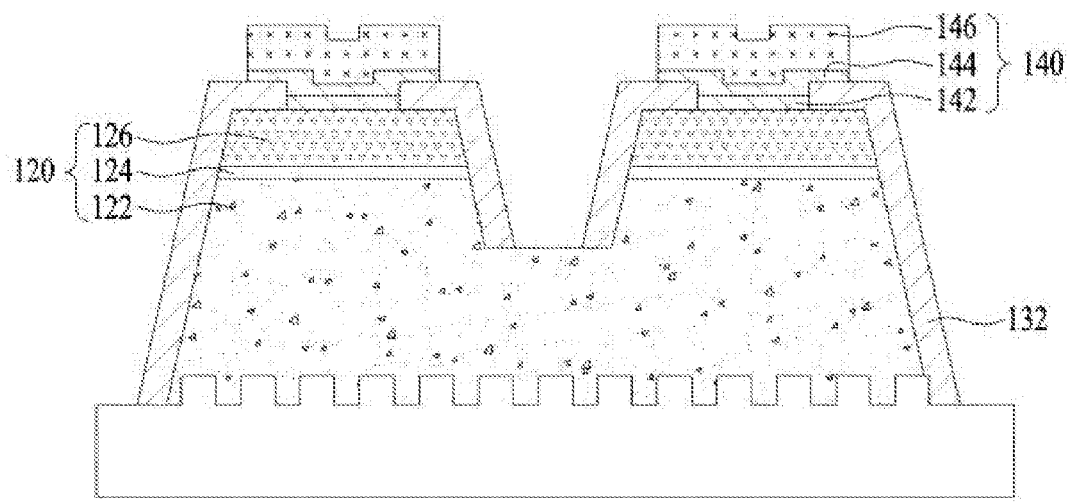
Figure 4F:
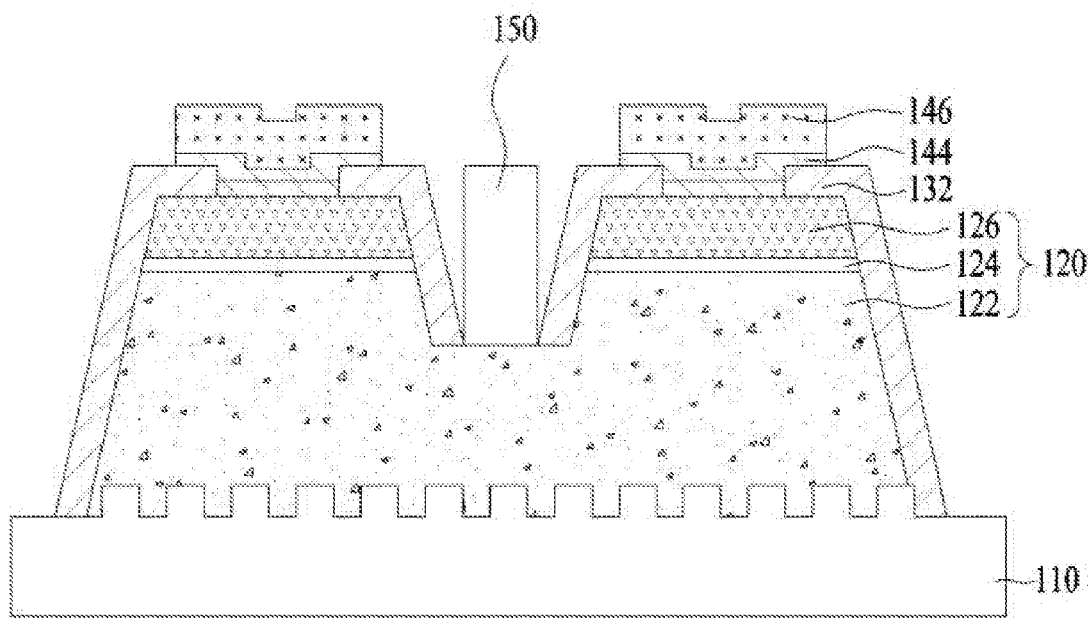
Figure 5B:
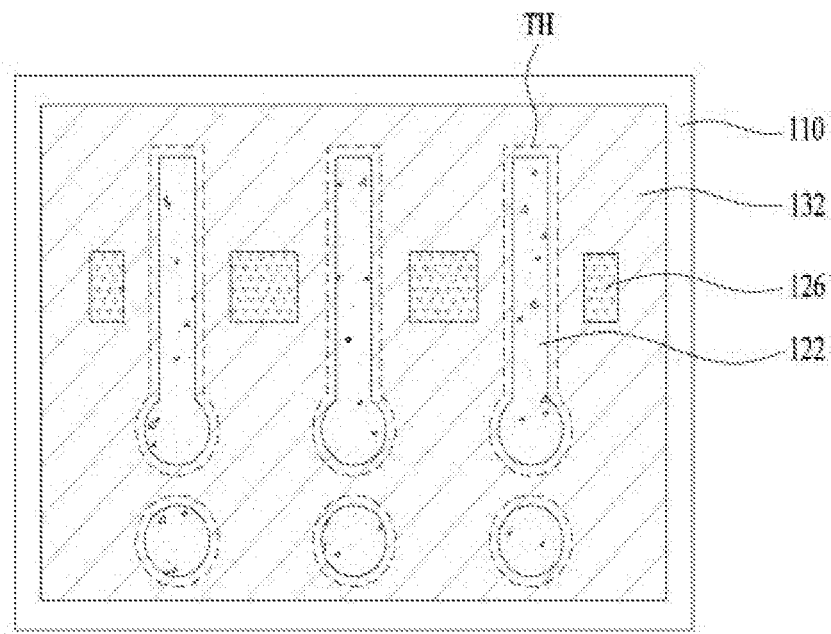

Referring to FIGS. 4C and 5B, a first insulating layer 132 may be formed on the sides of the second conductive semiconductor layer 126 and active layer 124 exposed at the through-hole TH and an outer sidewall SP of the light emitting structure 120. Forming the first insulating layer 132 may protect the light emitting structure 120, particularly the active layer 124, during a subsequent process shown in FIGS. 4D to 4F. For example, when a reflective layer 146 is formed of silver (Ag), the light emitting structure 120 may be protected from migration of the silver or from foreign materials or impurities by the first insulating layer 132.

Figure 5C:
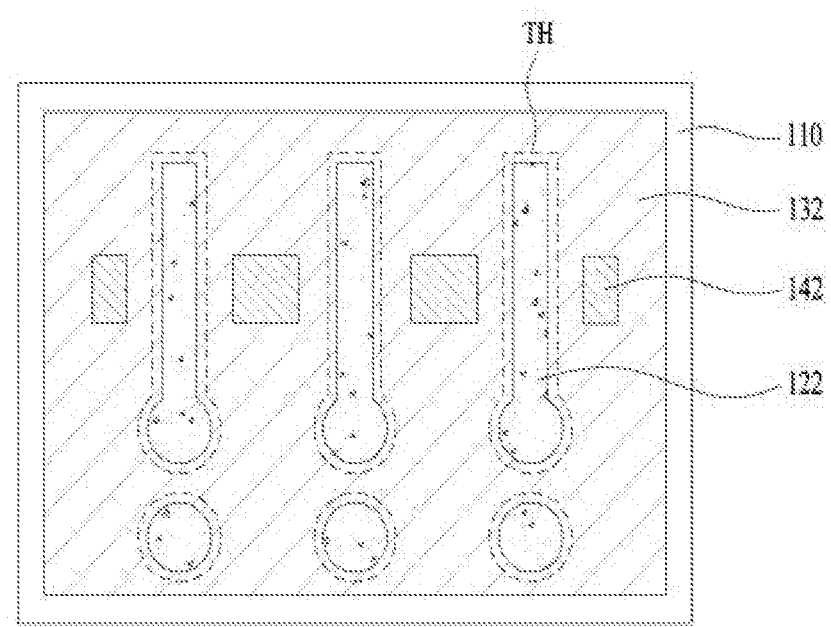
Figure 5D:
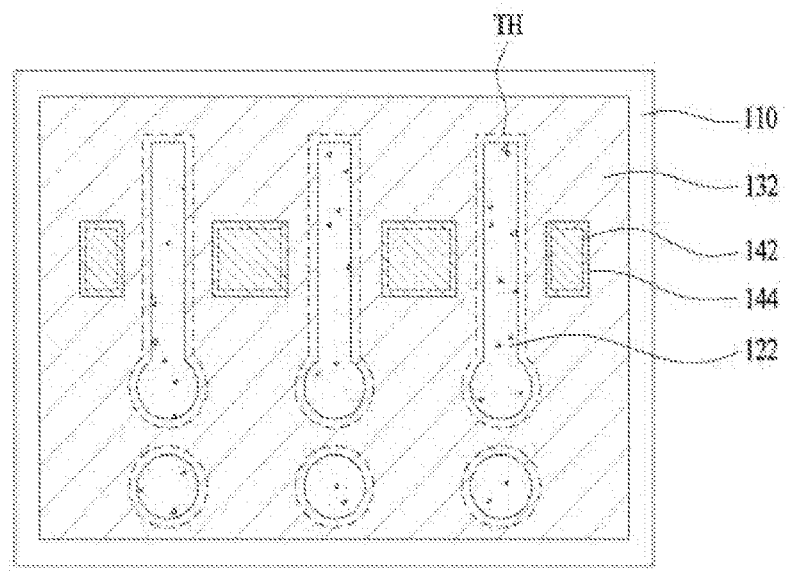

Referring to FIGS. 4C and 5C, a first light permeable electrode layer 142 may be formed on the second conductive semiconductor layer 126 not covered by the first insulating layer 132. Referring to FIGS. 4D and 5D, a second light permeable electrode layer 144 may be formed on a part of the first insulating layer 132 provided on the light emitting structure 120 and on the first light permeable electrode layer 142. At this point, the second light permeable electrode layer 144 may be formed to cover a boundary between the first insulating layer 132 and the first light permeable electrode layer 142 while maximizing an area of the second light permeable electrode layer 144 as much as possible. This is to maximize a size of a reflective region of the reflective layer 146 to be provided on the second light permeable electrode layer 144 by separating the reflective layer 146 from the first insulating layer 132. As described above, since the first light permeable electrode layer 142 has a thickness smaller than that of the first insulating layer 132, the second light permeable electrode layer 144 provided on the first light permeable electrode layer 142 and on the first insulating layer 132 may have a step.

Figure 5E:
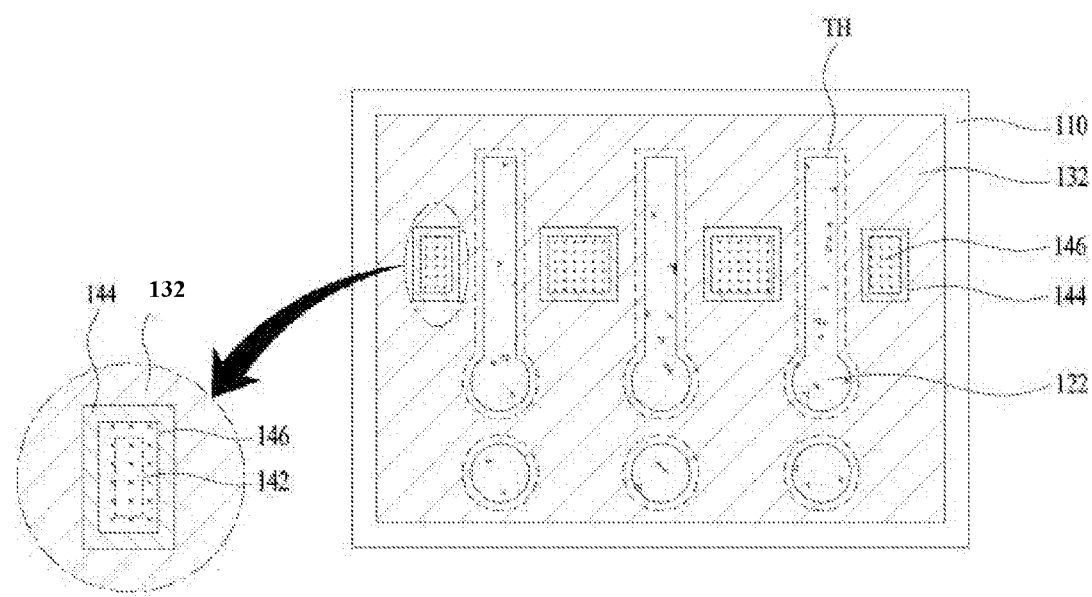

Referring to FIGS. 4E and 5E, the reflective layer 146 may be formed on the second light permeable electrode layer 144. At this point, since the second light permeable electrode layer 144 has a step, the reflective layer 146 provided on the second light permeable electrode layer 144 may also have a step, but the embodiment is not limited thereto. Thus, as described above, a second electrode 140 including the first light permeable electrode layer 142, the second light permeable electrode layer 144, and the reflective layer 146 may be formed.

Hereinafter, a detailed method of manufacturing the first insulating layer 132 and the second electrode 140 shown in FIGS. 4C to 4E may be described with reference to the accompanying FIGS. 6A to 6G, but the embodiment is not limited thereto. That is, the first insulating layer 132 and the second electrode 140 may obviously be manufactured by a method other than the method shown in FIGS. 6A to 6G.

Figure 6A:
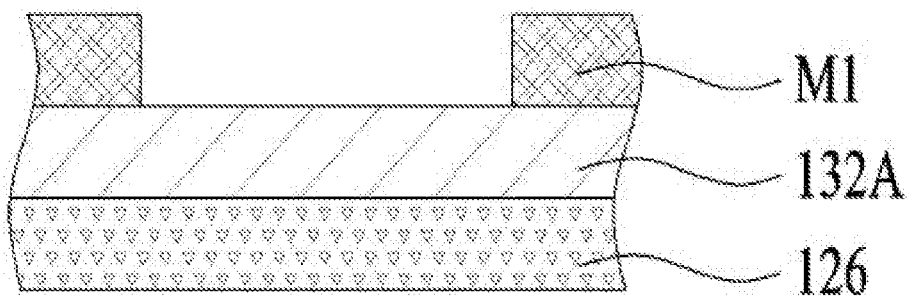
FIGS. 6A to 6G are process cross-sectional views illustrating a method of manufacturing a first insulating layer and a second electrode shown in FIGS. 4C to 4E according to an embodiment.

FIGS. 6A to 6G are process cross-sectional views illustrating a method of manufacturing a first insulating layer 132 and a second electrode 140 shown in FIGS. 4C to 4E according to an embodiment. Referring to FIG. 6A, after the through-hole TH is formed as shown in FIG. 4B, an insulator 132A for forming the first insulating layer 132 on the second conductive semiconductor layer 126 may be deposited. The insulator 132A may include at least one of $SiO_2$, $TiO_2$, $ZrO_2$, $Si_3N_4$, $Al_2O_3$, or $MgF_2$, but the embodiment is not limited thereto. With exposing a first light transmissible electrode region 132-1 of the insulator 132A, in which the first light permeable electrode layer 142 may be provided, a first mask pattern M1 may be formed on the insulator 132A. The first mask pattern M1 may be a photoresist mask.

Figure 6B:
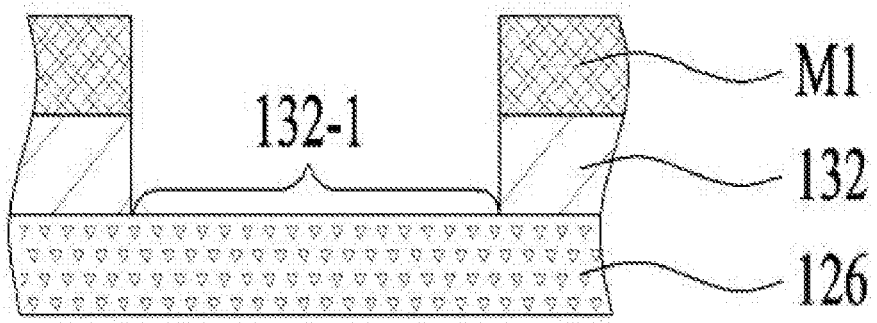

Referring to FIG. 6B, the insulator 132A may be etched using the first mask pattern M1 as an etching mask so that the first insulating layer 132 may be completed to expose the second conductive semiconductor layer 126 in a first light transmissible electrode region 132-1. As shown in FIG. 4B, the first insulating layer 132 may be simultaneously formed on the outer sidewall SP of the light emitting structure 120 and on sides of the second conductive semiconductor layer 126 and the active layer 124 which are exposed at the through-hole TH.

Figure 6C:
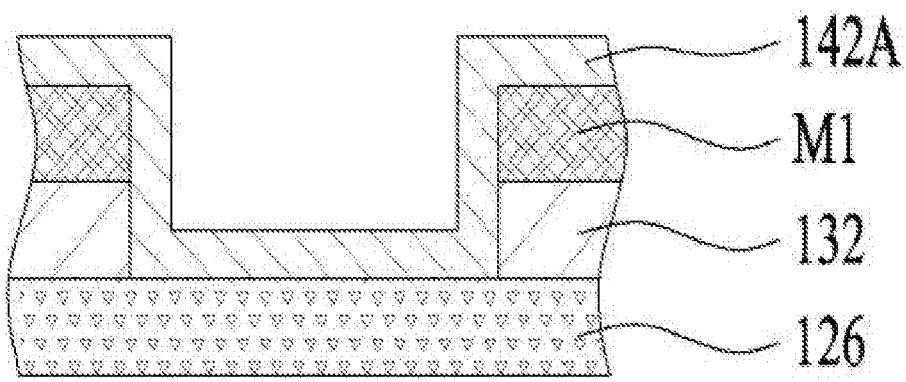
Figure 6D:
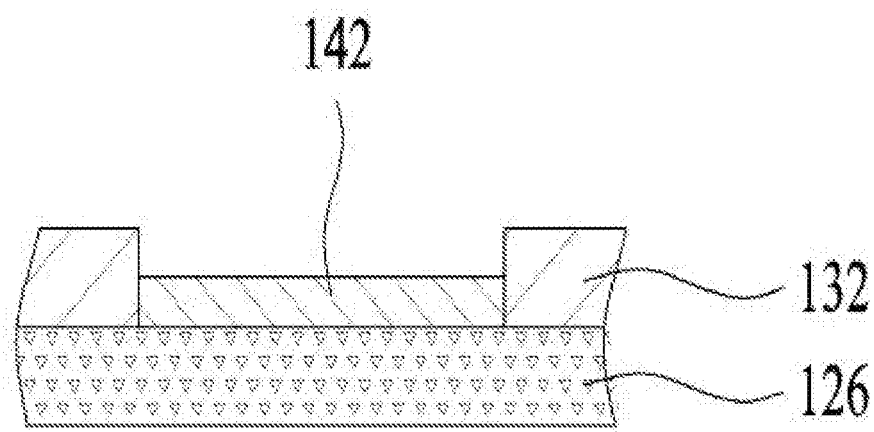

Referring to FIG. 6C, a first electrode material 142A for forming the first light permeable electrode layer 142 may be deposited on the first mask pattern M1 and on the second conductive semiconductor layer 126 exposed at the first light transmissible electrode region 132-1. Referring to FIG. 6D, the first electrode material 142A and the first mask pattern M1 deposited on the first mask pattern M1 may be simultaneously lifted off and removed, and thus, the first light permeable electrode layer 142 may be formed in the first light transmissible electrode region 132-1. Then, a thermal process may be performed on the first light permeable electrode layer 142, and thus, the second conductive semiconductor layer 126 may ohmic-contact the first light permeable electrode layer 142.

Figure 6E:
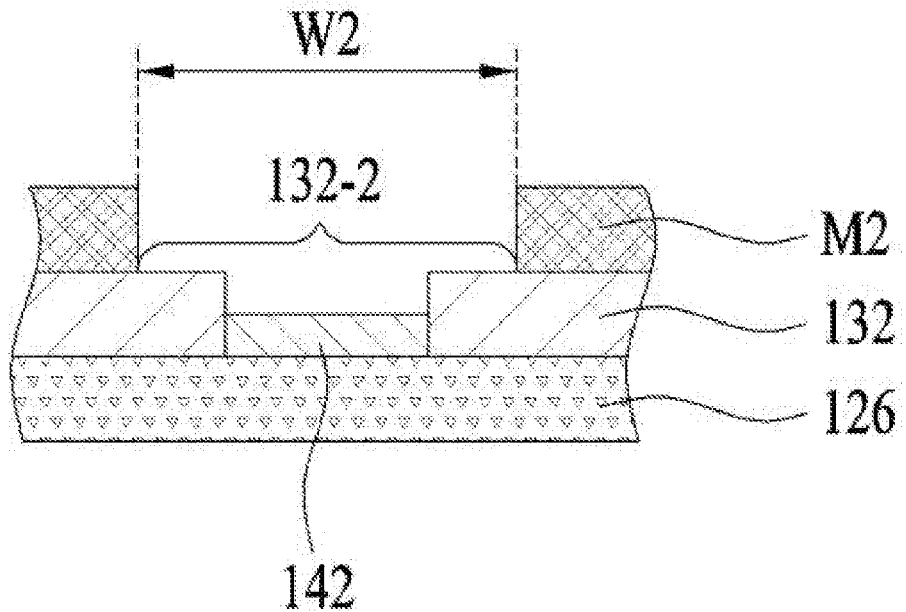
Figure 6F:
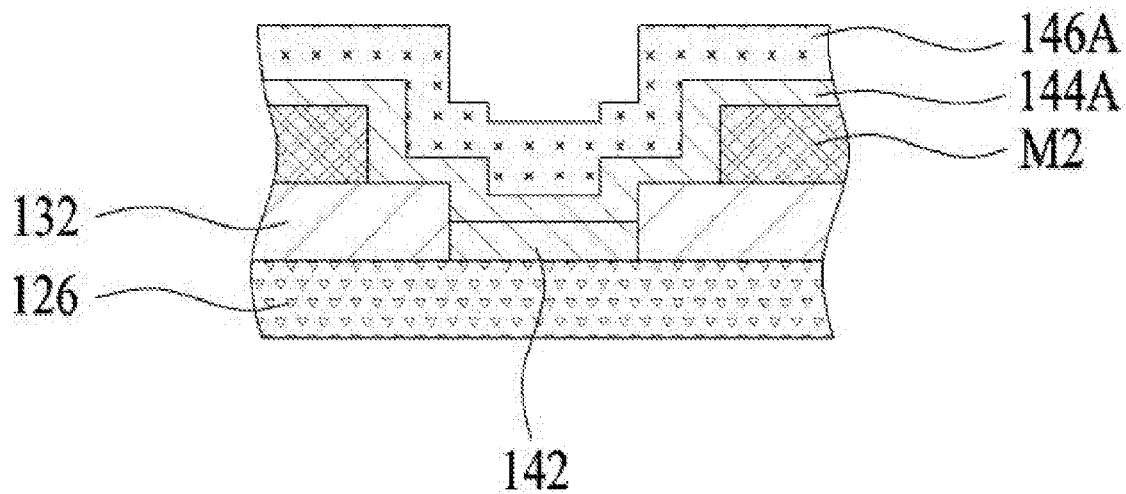

Referring to FIG. 6E, a second mask pattern M2 that exposes a second light transmissible electrode region 132-2, in which the second light permeable electrode layer 144 may be formed, may be formed on the first insulating layer 132. The second mask pattern M2 may be a photoresist (PR) mask. Referring to FIG. 6F, a second electrode material 144A for forming the second light permeable electrode layer 144 and a reflective material 146A for forming the reflective layer 146 may be sequentially deposited and formed on the first light permeable electrode layer 142 and the first insulating layer 132 in the second light transmissible electrode region 132-2 and the second mask pattern M2.

Each of the first and second electrode materials 142A and 144A may be TCO. For example, each of the first and second electrode materials 142A and 144A may include at least one of ITO, IZO, IZTO, IAZO, IGZO, IGTO, AZO, ATO, GZO, IrOx, RuOx, RuOx/ITO, Ni/IrOx/Au, or Ni/IrOx/Au/ITO but is not limited to the above materials. The reflective material 146A may include a metal of aluminum (Al), gold (Au), silver (Ag), nickel (Ni), platinum (Pt), rhodium (Rh), titanium (Ti), chrome (Cr), or a metal including an alloy having Al, Ag, Pt, or Rh.

Figure 6G:
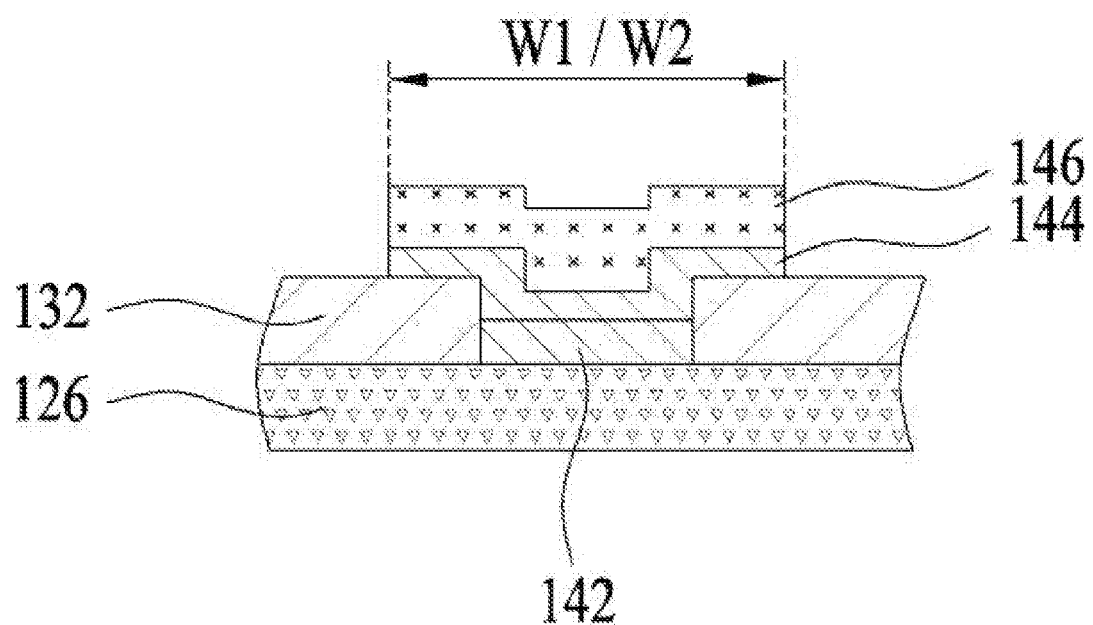

Referring to FIG. 6F, the second electrode material 144A and the reflective material 146A provided on the second mask pattern M2 and the second mask pattern M2 may be simultaneously lifted off and removed, and thus, as shown in FIG. 6G, the second light permeable electrode layer 144 and the reflective layer 146 may be formed. When the second light permeable electrode layer 144 and the reflective layer 146 are formed by the above-described lift-off manner, as shown in the drawing, the first width W1 of the reflective layer 146 may become the same as the second width W2 of the second light permeable electrode layer 144. Further, since the reflective layer 146 is formed on the second light permeable electrode layer 144, the reflective layer 146 may be separated from the first insulating layer 132.

Generally, a thermal process may be performed on the first light permeable electrode layer 142 at a high temperature of about 600° C. or more so that the second conductive semiconductor layer 126 may ohmic-contact the first light permeable electrode layer 142. At this point, when silver (Ag) is used for the reflective material 146A, the silver (Ag) may agglomerate at the high temperature because silver (Ag) agglomerates at a high temperature of 400° C. or higher. Therefore, an additional mask pattern may be used for separating a process of manufacturing the first light permeable electrode layer 142 from a process of manufacturing the reflective layer 146.

However, according to the embodiment, after the first insulating layer 132 is formed by using one mask pattern M, the first mask pattern M1 may not be removed to form a first light permeable electrode layer 142 using the first mask pattern M. Thus, the first insulating layer 132 and the first light permeable electrode layer 142 may be formed by only one mask pattern M. Further, the second light permeable electrode layer 144 and the reflective layer 146 may be simultaneously formed using the second mask pattern M2 without requiring an additional mask pattern for forming the reflective layer 146. Accordingly, in the method of manufacturing the light emitting device package according to the embodiment, the number of mask patterns may be decreased and a process time may be shortened.

Figure 5F:
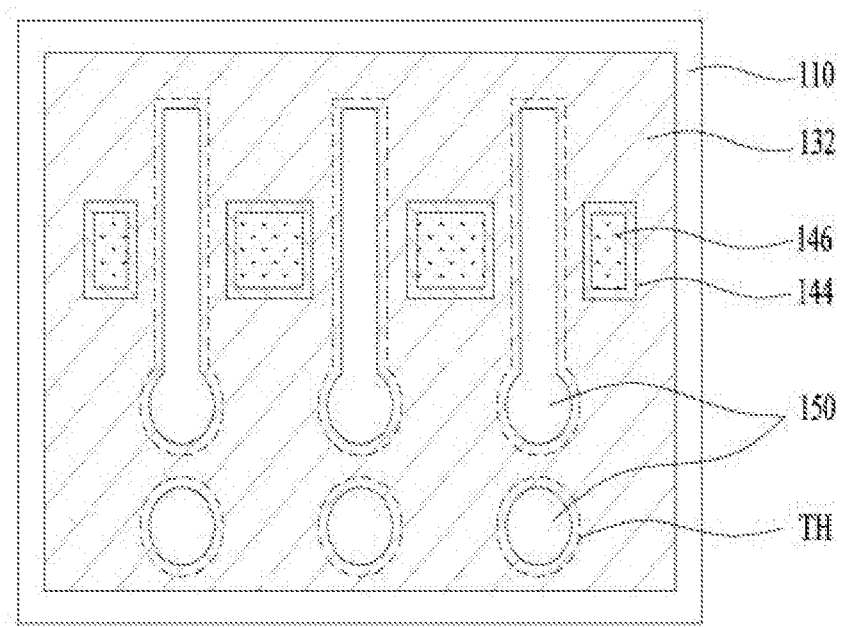

As shown in FIG. 4E, after the second electrode 140 is formed, referring to FIGS. 4F and 5F, the first electrode 150 may be formed on the first conductive semiconductor layer 122 exposed at the through-hole TH. The first electrode 150 may be formed of a metal and may also be formed of Ag, Ni, Ti, Al, Rh, Pd, Ir, Ru, Mg, Zn, Pt, Au, Hf, Cr, or a selective combination thereof.

Figure 4G:
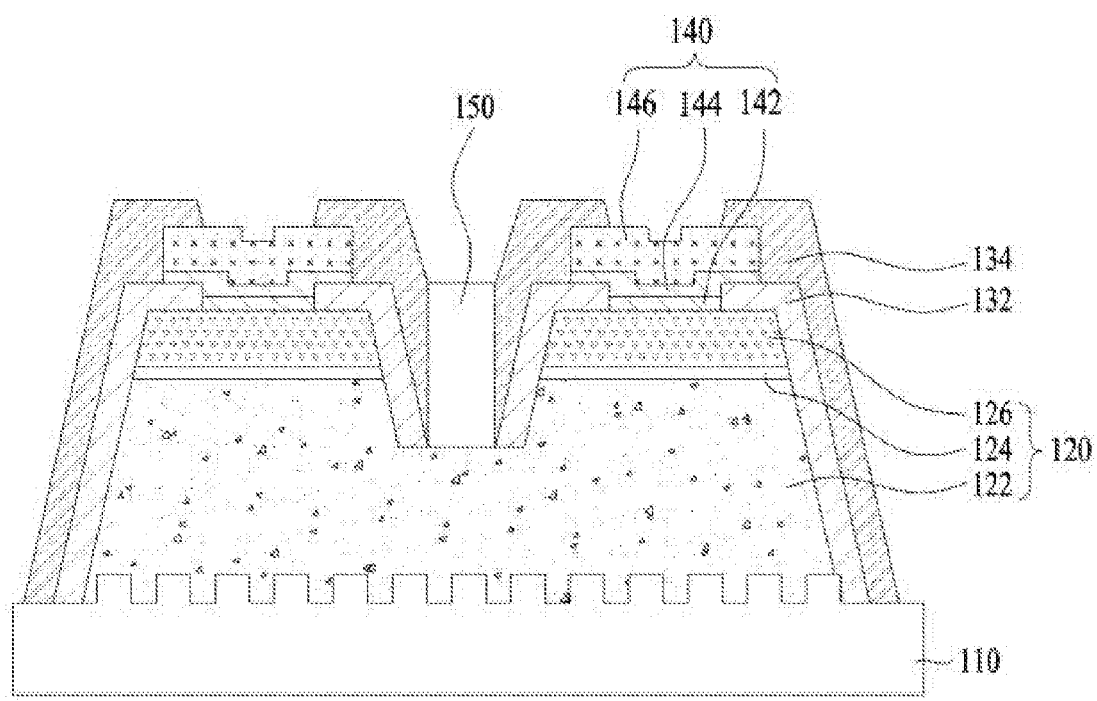
Figure 5G:
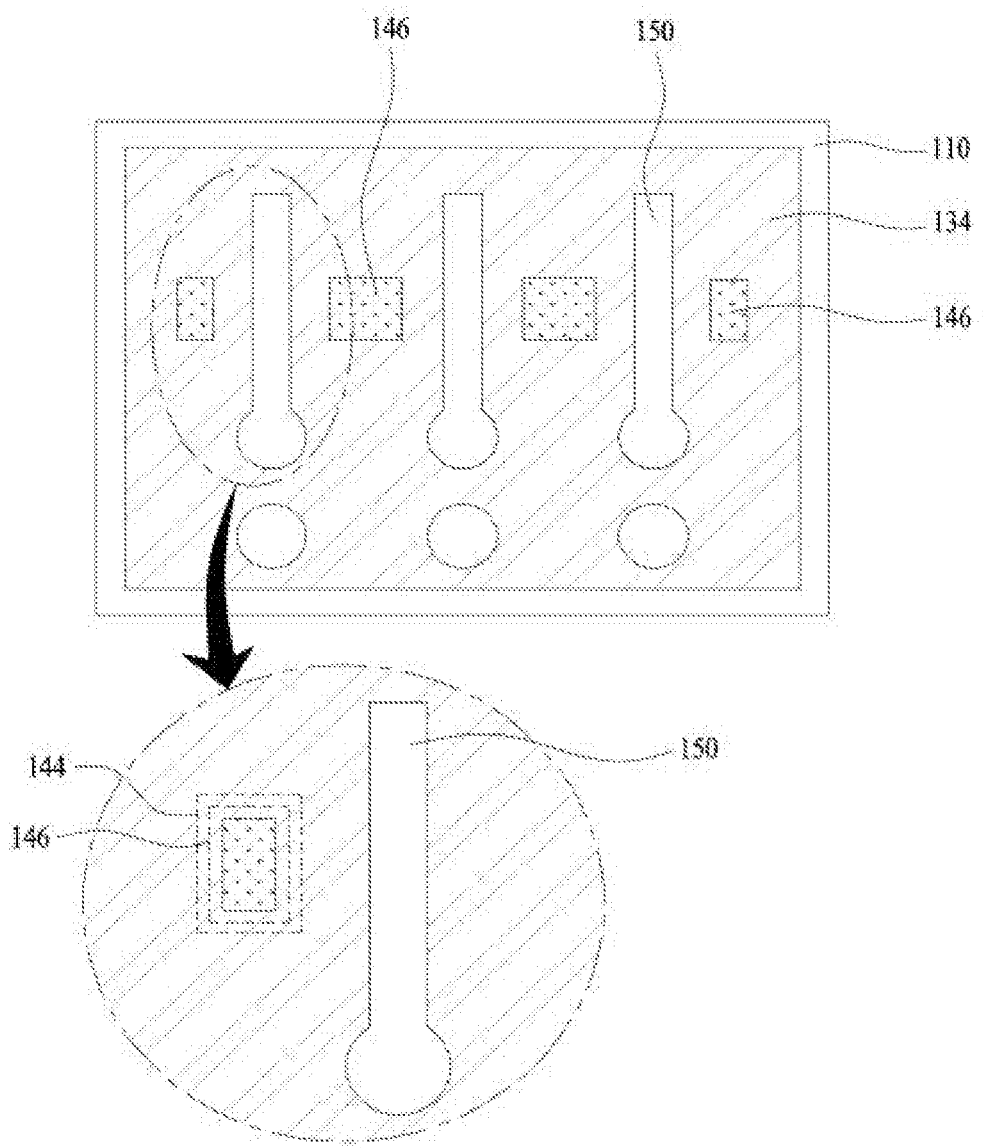

Referring to FIGS. 4G and 5G, a second insulating layer 134 may be formed. The second insulating layer 134 may be formed on sides and an upper surface of the first insulating layer 132 deposited on the outer sidewall SP of the light emitting structure 120. Further, the second insulating layer 134 may surround sides and upper surfaces of each of the second light permeable electrode layer 144 and the reflective layer 146. The second insulating layer 134 may be formed on the reflective layer 146 while exposing a portion to be electrically connected to the second bonding pad 164.

The second insulating layer 134 may be buried in the through-hole TH, while surrounding sides of the first electrode 150 and exposing an upper portion of the first electrode 150 buried in the through-hole TH. Each of the insulator 132A forming the first insulating layer 132 or the second insulating layer 134 may include at least one of $SiO_2$, $TiO_2$, $ZrO_2$, $Si_3N_4$, $Al_2O_3$, or $MgF_2$. The first and second insulating layers 132 and 134 may be formed to have substantially the same materials or materials different from each other.

Figure 4H:
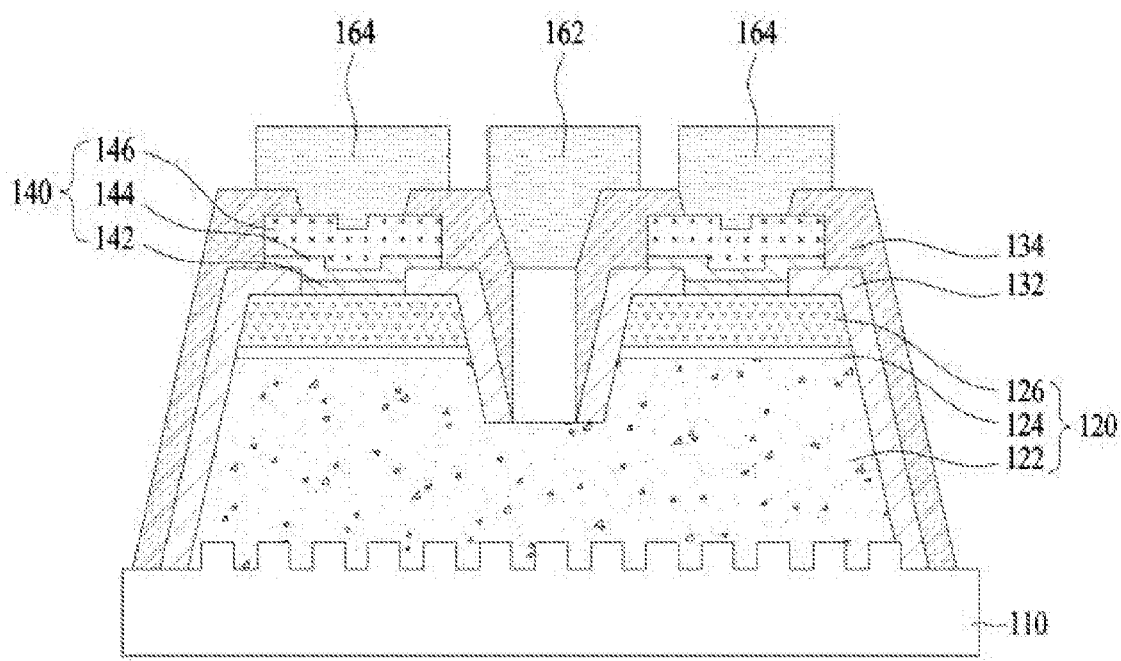

Referring to FIG. 4H, a first bonding pad 162 may be formed on the first electrode 150 exposed and not covered by the second insulating layer 134, and a second bonding pad 164 may be formed on the reflective layer 146 exposed and not covered by the second insulating layer 134. Each of the first and second bonding pads 162 and 164 may be formed using a metal material having an electrical conductivity. For example, each of the first and second bonding pads 162 and 164 may be formed using at least one of Ti, Ni, Au, or Sn.

Figure 7:
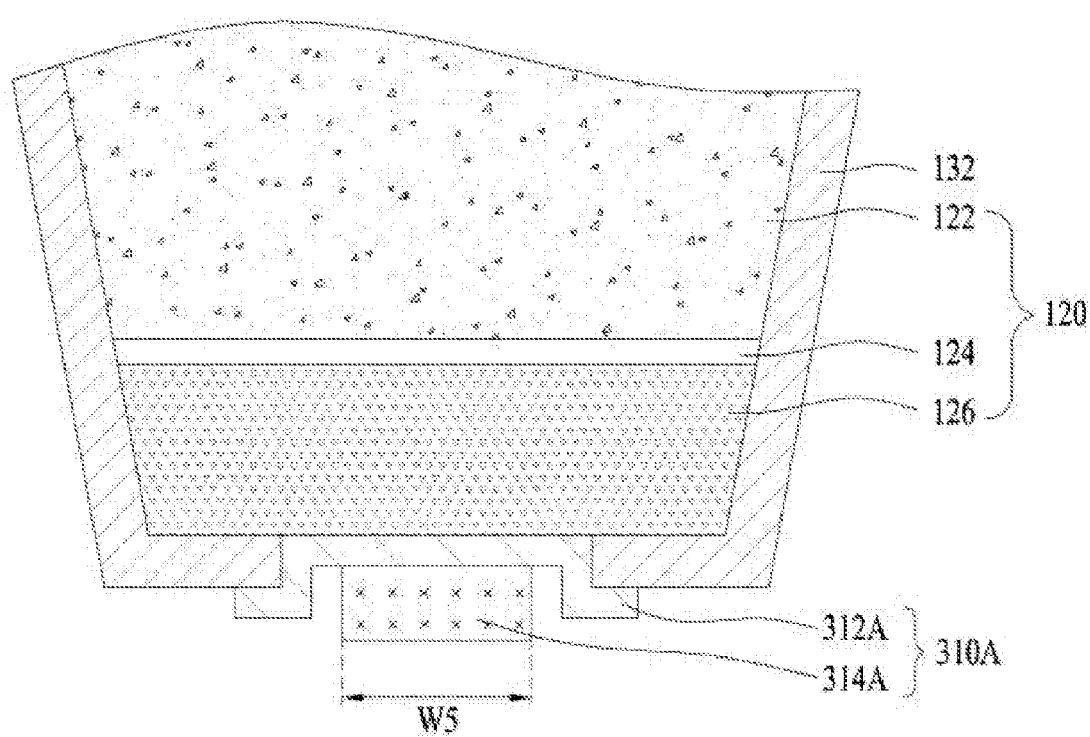
FIG. 7 is a cross-sectional view illustrating a light emitting device according to a first comparative example.

Hereinafter, the light emitting device 100 according to the embodiment shown in FIG. 3 and light emitting devices according to comparative examples may be described with reference to the accompanying drawings. FIG. 7 is a cross-sectional view illustrating a light emitting device according to a first comparative example. A light emitting device according to the first comparative example shown in FIG. 7 may include a light emitting structure 120, a first insulating layer 132, and a second electrode 310A. Since the light emitting structure 120 and the first insulating layer 132 are the same as the light emitting structure 120 and the first insulating layer 132 shown in FIG. 3 respectively, same reference numbers may been used, and repeated descriptions have been omitted. That is, except for a different cross-sectional shape of the second electrode 310A, the light emitting device according to the first comparative example shown in FIG. 7 may be similar to the light emitting device according to the embodiment shown in FIG. 3.

A second electrode 310A shown in FIG. 7 may include a first light permeable electrode layer 312A and a reflective layer 314A. The first light permeable electrode layer 312A and the reflective layer 314A may perform same or similar functions as the first light permeable electrode layer 142 and the reflective layer 146 shown in FIG. 3, respectively. The first light permeable electrode layer 312A shown in FIG. 7 may be provided to extend from the second conductive semiconductor layer 126 exposed by the first insulating layer 132 to a lower portion of the first insulating layer 132. The reflective layer 314A may have a fifth width W5. As described above, when the reflective layer 314A does not overlap the first insulating layer 132, although the first light permeable electrode layer 312A overlaps the reflective layer 314A in a thickness direction of the light emitting structure 120, since the fifth width W5 of the reflective layer 314A is small, a light reflection function of the reflective layer 314A may become diminished.

Alternatively, in the light emitting device 100 shown in FIG. 3, the first insulating layer 132, the first light permeable electrode layer 142, and the reflective layer 146 may overlap each other in a thickness direction of the light emitting structure 120. Thus, the first width W1 of the reflective layer 146 may increase to be more than the fifth width W5 of the reflective layer 314A according to the first comparative example shown in FIG. 7. As described above, in the light emitting device 100 according to the embodiment, since the first width W1 of the reflective layer 146 is greater than the first comparative example, a light reflection function of the reflective layer 146 may be relatively enhanced more than that of the first comparative example, and luminous flux may be increased.

Figure 8:
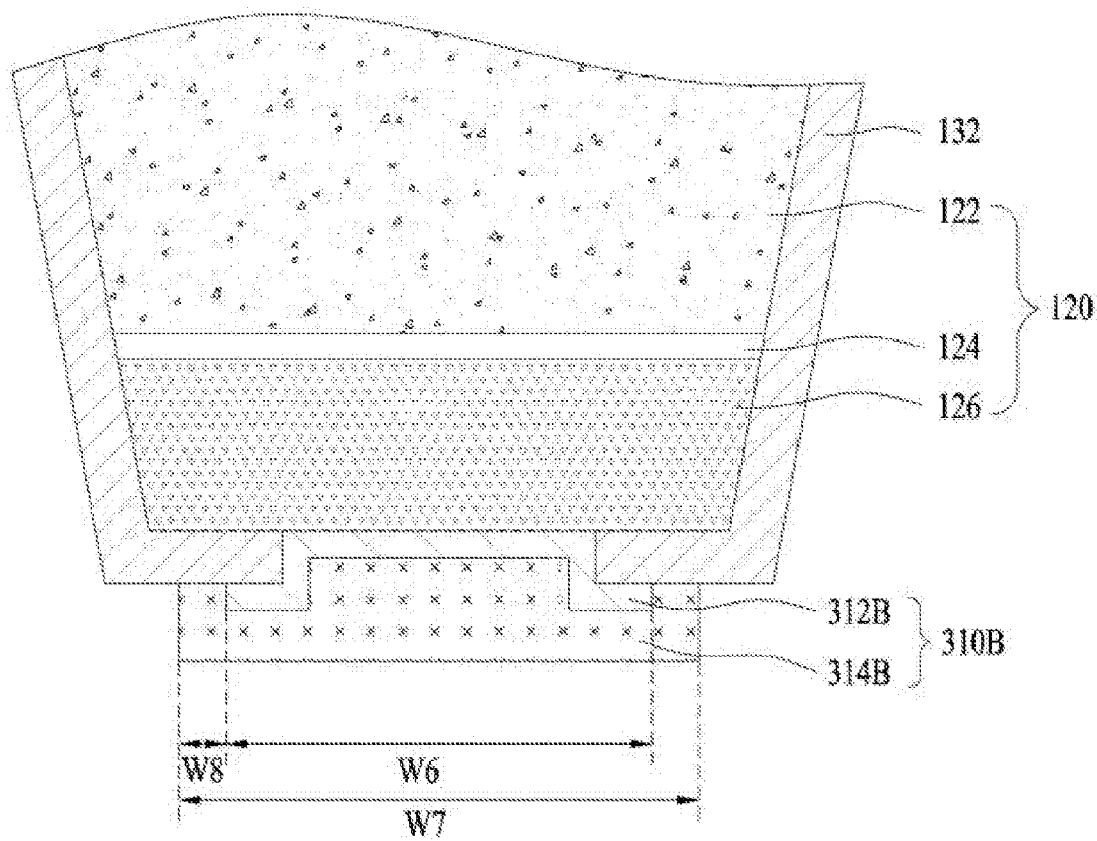
FIG. 8 is a cross-sectional view illustrating a light emitting device according to a second comparative example.

FIG. 8 is a cross-sectional view illustrating a light emitting device according to a second comparative example. The light emitting device according to the second comparative example shown in FIG. 8 may include a light emitting structure 120, a first insulating layer 132, and a second electrode 310B. Since the light emitting structure 120 and the first insulating layer 132 are the same as the light emitting structure 120 and the first insulating layer 132 shown in FIG. 3, respectively, same reference numbers may be used, and repeated descriptions have been omitted. That is, except for a different cross-sectional shape of the second electrode 310B, the light emitting device according to the second comparative example shown in FIG. 8 may be similar to the light emitting device according to the embodiment shown in FIG. 3.

The second electrode 310B shown in FIG. 8 may include a first light permeable electrode layer 312B and a reflective layer 314B. The first light permeable electrode layer 312B and the reflective layer 314B may perform similar functions as the first light permeable electrode layer 142 and the reflective layer 146 shown in FIG. 3, respectively.

Figure 9:
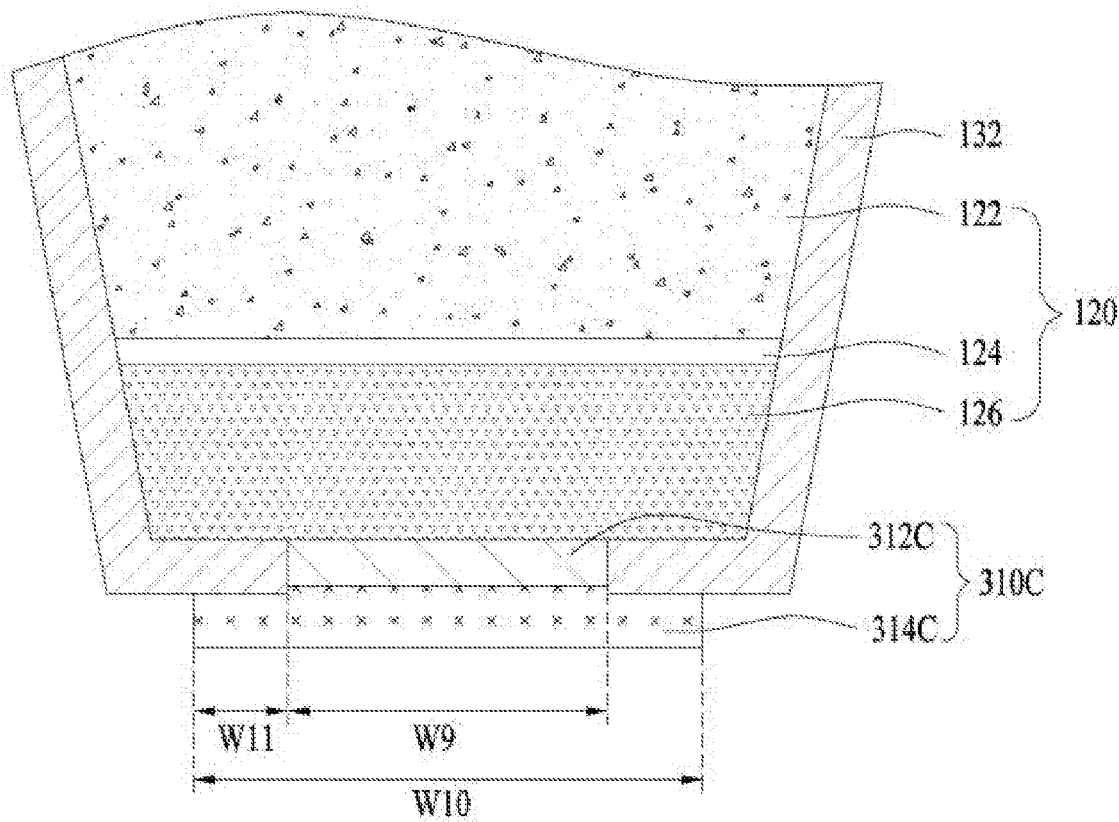
FIG. 9 is a cross-sectional view illustrating a light emitting device according to a third comparative example.

FIG. 9 is a cross-sectional view illustrating a light emitting device according to a third comparative example. The light emitting device according to the third comparative example shown in FIG. 9 may include a light emitting structure 120, a first insulating layer 132, and a second electrode 310C. Since the light emitting structure 120 and first insulating layer 132 are the same as the light emitting structure 120 and the first insulating layer 132 shown in FIG. 3, respectively, same reference numbers may be used, and repeated descriptions have been omitted. That is, except for a different cross-sectional shape of the second electrode 310C, the light emitting device according to the third comparative example shown in FIG. 9 is similar to the light emitting device according to the embodiment shown in FIG. 3.

The second electrode 310C shown in FIG. 9 may include a first light permeable electrode layer 312C and a reflective layer 314C. The first light permeable electrode layer 312C and the reflective layer 314C may perform similar functions as the first light permeable electrode layer 142 and the reflective layer 146 shown in FIG. 3, respectively.

To eliminate a disadvantage of the light emitting device according to the first comparative example shown in FIG. 7, for example, a small size of the fifth width W5 of the reflective layer 314A, the reflective layers 3146 and 314C according to the second and third comparative examples shown in FIGS. 8 and 9 have seventh and tenth widths W7 and W10 respectively greater than sixth and ninth widths W6 and W9 of the first light permeable electrode layers 312B and 312C. Since the seventh and tenth widths W7 and W10 of the reflective layers 314B and 314C are increased compared to the fifth width W5 shown in FIG. 7, an improvement of the luminous flux may be expected. However, in the light emitting device according to the second and third comparative examples shown in FIGS. 8 and 9, the reflective layers 314B and 314C may be in direct contact with the first insulating layer 132 by eighth and eleventh widths W8 and W11. When the reflective layers 314B and 314C are silver and the first insulating layer 132 is $SiO_2$, since the reflective layers 314B and 314C are in direct contact with the first insulating layer 132, a delamination therebetween may occur.

In the light emitting device according to the embodiment shown in FIG. 3, the reflective layer 146 may not be in direct contact with the first insulating layer 132 and may be provided to be separated from the first insulating layer 132. To this end, in the light emitting device according to the embodiment, the second light permeable electrode layer 144 may be interposed between the first light permeable electrode layer 142 and the reflective layer 146, and the reflective layer 146 having the first width W1 equal to or less than the second width W2 of the second light permeable electrode layer 144 may be provided under the second light permeable electrode layer 144. Since the reflective layer 146 is separated from the first insulating layer 132, a concern for delamination between the first insulating layer 132 and the reflective layer 146 as shown in the above described second and third comparative examples may be eliminated. Further, since the second light permeable electrode layer 144 is interposed between the reflective layer 146 and the first light permeable electrode layer 142, the width of the reflective layer 146 may be increased by an amount expressed by the following Expression 1.

$$\Delta W1+\Delta W2+W31+W32 \quad \text{[Expression 1]}$$

Here, a sum of ΔW1 and ΔW2 refers to the difference value between the first width W1 and the second width W2, and W31 as aforementioned and W32 refer to the above described third width.

Thus, in the light emitting device according to the embodiment, the width of the reflective layer 146 may be increased, an amount of light reflected from the reflective layer 146 may be further increased, and luminous flux may be improved. For example, in the light emitting device according to the first comparative example shown in FIG. 7, which did not include the second light permeable electrode layer 144, the area of the reflective layer 314A may be 730,557 μm$^2$, whereas, in the light emitting device shown in FIG. 3, which included the second light permeable electrode layer 144, the area of the reflective layer 146 may be 771,839 μm$^2$ and thus, may be increased by about 5.6% compared to the first comparative example.

Further, when a sum of the first thickness T1 of the first light permeable electrode layer 142 and the third thickness T3 of the second light permeable electrode layer 144 is large, spreading of the second conductive carrier may be improved, thereby decreasing a forward operating voltage Vf. However, when the sum of the first thickness T1 and the third thickness T3 is too large, the luminous flux may be decreased. In consideration of this, each of the first and third thicknesses T1 and T3 may be in a range of several nanometers to several tens of nanometers, for example, in a range of about 3 nm to 10 nm, but the embodiment is not limited thereto.

A plurality of light emitting device packages according to the embodiment may be arrayed on a substrate, and optical members such as, e.g., a light guide plate, a prism sheet, and a diffusion sheet, may be provided on a path of light of the light emitting device package. The light emitting device package, the substrate, and the optical members may serve as a backlight unit. The light emitting device package according to the embodiment may be applied to display devices, indicator devices, or lighting apparatuses. The display device may include a bottom cover, a reflective plate provided on the bottom cover, a light emitting module that emits light, a light guide plate provided in front of the reflective plate and configured to guide light emitted from the light emitting module in a forward direction, an optical sheet including prism sheets provided in front of the light guide plate, a display panel provided in front of the optical sheet, an image signal output circuit connected to the display panel and configured to supply an image signal to the display panel, and a color filter provided in front of the display panel. The bottom cover, the reflective plate, the light emitting module, the light guide plate, and the optical sheet may form a backlight unit.

Further, the lighting apparatus may include a substrate, a light source module including the light emitting device package according to the embodiment, a heat dissipater that dissipates heat of the light source module, and a power supply that processes or converts an electrical signal provided from the outside and provides the processed or converted electrical signal to the light source module. For example, the lighting apparatus may include a lamp, a head lamp, or a street lamp. The head lamp may include a light emitting module including light emitting device packages provided on a substrate, a reflector that reflects light emitted from the light emitting module in a predetermined direction, for example, in a forward direction, a lens that refracts light reflected from the reflector in a forward direction, and a shade that blocks or reflects a part of the light, which is reflected from the reflector and directed to a lens, so that a light distribution pattern desired by a designer may be formed.

In the light emitting device and the light emitting device package according to the embodiment, the reflective layer and the first insulating layer provided under the light emitting structure may be separated from each other, thus there may be no concern over delamination, and since the number of mask patterns is decreased, a process time may be shortened and a manufacturing cost may be reduced. In addition, by increasing the width of the above described reflective layer, the luminous flux may be improved, and by improving the spreading of the second conductive carrier, the forward operating voltage may be decreased.

Embodiments disclosed herein provide a light emitting device having an improved luminous flux and a light emitting device package including the same. According to the embodiment, a light emitting device may include a substrate; a light emitting structure provided under the substrate and including a first conductive semiconductor layer, an active layer, and a second conductive semiconductor layer; a first insulating layer configured to expose the second conductive semiconductor layer and provided at a lower edge of the light emitting structure; a first light permeable electrode layer provided under the second conductive semiconductor layer exposed by the first insulating layer; a second light permeable electrode layer provided under the first insulating layer and the first light permeable electrode layer; and a reflective layer provided under the second light permeable electrode layer.

The reflective layer may be separated from the first insulating layer by the second light permeable electrode layer. The second light permeable electrode layer may include a first surface configured to face the light emitting structure, and a second surface opposite the first surface, wherein the entire reflective layer may be provided under the second surface. At least parts or portions of the first insulating layer, the second light permeable electrode layer, or the reflective layer may overlap with each other in a thickness direction of the light emitting structure. A width of the first insulating layer provided on the lower edge of the light emitting structure may be in a range of about 10 μm to 40 μm. An overlapping width at which the first insulating layer, the second light permeable electrode layer, and the reflective layer overlap in the thickness direction may be 5 μm.

A thickness of each of the first and second light permeable electrode layers may be in a range of several nanometers to several tens of nanometers. The second light permeable electrode layer may be provided to cover a boundary between the first light permeable electrode layer and the first insulating layer. In a first direction that intersects a thickness direction of the light emitting structure, a first width of the reflective layer may be equal to or less than a second width of the second light permeable electrode layer. The first insulating layer may include SiO2, and the reflective layer may include silver (Ag).

The light emitting device may further include a first electrode provided under the first conductive semiconductor layer exposed at a through-hole that passes through the second conductive semiconductor layer and the active layer with or while exposing the first conductive semiconductor layer. The first insulating layer may be provided to extend from the lower edge of the light emitting structure to a side of the light emitting structure exposed at the through-hole. The first and second light permeable electrode layers may be formed of a same material as or materials different from each other.

According to the embodiment, there is provided a light emitting device package including: the light emitting device; a first bonding pad connected to the first conductive semiconductor layer; a second bonding pad separated from the first bonding pad and connected to the second conductive semiconductor layer; and a second insulating layer provided between the first bonding pad and the second light permeable electrode layer and between the first bonding pad and the reflective layer. The light emitting device package may further include first and second lead frames respectively and electrically connected to the first and second bonding pads, and a molding member configured to surround the light emitting device.

According to the embodiment, there is provided a light emitting device including: a substrate; a light emitting structure provided under the substrate and including a first conductive semiconductor layer, an active layer, and a second conductive semiconductor layer; a first insulating layer configured to expose the second conductive semiconductor layer and provided under the light emitting structure; a plurality of light permeable electrode layers provided under the exposed second conductive semiconductor layer with overlapping the second conductive semiconductor layer in a thickness direction of the light emitting structure; and a reflective layer separated from the first insulating layer by at least one of the plurality of light permeable electrode layers and provided under the plurality of light permeable electrode layers.

The plurality of light permeable electrode layers may include a first light permeable electrode layer provided in contact with the exposed second conductive semiconductor layer, and a second light permeable electrode layer provided under the first light permeable electrode layer and under the first insulating layer to separate the first insulating layer from the reflective layer. A thickness of the first light permeable electrode layer may be smaller than a thickness of the first insulating layer. At least parts of the second light permeable electrode layer, the first electrode layer, and the reflective layer may overlap with each other in the thickness direction of the light emitting structure.

It should be understood that when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Further, the relational terms such as "first" and "second," "over/upper portion/above," and "below/lower portion/under" do not necessarily require or include any physical or logical relationship or sequence between devices or elements and may also be used to distinguish one device or element from another device or element.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a light emitting structure disposed under the substrate and including a first conductive semiconductor layer, an active layer, and a second conductive semiconductor layer;
   a first insulating layer configured to expose the second conductive semiconductor layer and disposed on a lower edge of the light emitting structure;
   a first light permeable electrode layer disposed under the second conductive semiconductor layer exposed by the first insulating layer;
   a second light permeable electrode layer disposed under the first insulating layer and the first light permeable electrode layer; and
   a reflective layer disposed under the second light permeable electrode layer.

2. The light emitting device of claim 1, wherein the reflective layer is separated from the first insulating layer by the second light permeable electrode layer.

3. The light emitting device of claim 1, wherein the second light permeable electrode layer includes:
   a first surface configured to face the light emitting structure; and
   a second surface opposite the first surface, wherein an entirety of the reflective layer is disposed under the second surface.

4. The light emitting device of claim 1, wherein at least portions of the first insulating layer, the second light permeable electrode layer, or the reflective layer overlap with each other in a thickness direction of the light emitting structure.

5. The light emitting device of claim 4, wherein a width of the first insulating layer disposed on the lower edge of the light emitting structure is in a range of about 10 μM to 40 μm.

6. The light emitting device of claim 5, wherein an overlapping width at which the first insulating layer, the second light permeable electrode layer, and the reflective layer overlap in the thickness direction is 5 μm.

7. The light emitting device of claim 1, wherein a thickness of each of the first and second light permeable electrode layers is in a range of several nanometers to several tens of nanometers.

8. The light emitting device of claim 1, wherein the second light permeable electrode layer is disposed to cover a boundary between the first light permeable electrode layer and the first insulating layer.

9. The light emitting device of claim 1, wherein, in a first direction that intersects a thickness direction of the light emitting structure, a first width of the reflective layer is equal to or less than a second width of the second light permeable electrode layer.

10. The light emitting device of claim 1, wherein the first insulating layer includes $SiO_2$, and the reflective layer includes silver (Ag).

11. The light emitting device of claim 1, further including a first electrode disposed under the first conductive semiconductor layer is exposed at a through-hole that passes through the second conductive semiconductor layer and the active layer while exposing the first conductive semiconductor layer.

12. The light emitting device of claim 11, wherein the first insulating layer is disposed to extend from the lower edge of the light emitting structure to a side of the light emitting structure exposed at the through-hole.

13. The light emitting device of claim 1, wherein the first and second light permeable electrode layers are formed of a same material as each other.

14. The light emitting device of claim 1, wherein the first and second light permeable electrode layers are formed of materials different from each other.

15. A light emitting device package having the light emitting device of claim 1, wherein the light emitting device package further includes:
   a first bonding pad connected to the first conductive semiconductor layer;
   a second bonding pad separated from the first bonding pad and connected to the second conductive semiconductor layer; and
   a second insulating layer disposed between the first bonding pad and the second light permeable electrode layer and between the first bonding pad and the reflective layer.

16. The light emitting device package of claim 15, wherein the light emitting device package further includes:
   first and second lead frames electrically connected to the first and second bonding pads, respectively; and
   a molding member configured to surround the light emitting device.

17. A light emitting device, comprising:
   a substrate;
   a light emitting structure disposed under the substrate and including a first conductive semiconductor layer, an active layer, and a second conductive semiconductor layer;
   a first insulating layer configured to expose the second conductive semiconductor layer and disposed under the light emitting structure;

a plurality of light permeable electrode layers disposed under the exposed second conductive semiconductor layer that overlaps the second conductive semiconductor layer in a thickness direction of the light emitting structure; and a reflective layer separated from the first insulating layer by at least one of the plurality of light permeable electrode layers and disposed under the plurality of light permeable electrode layers.

18. The light emitting device of claim 17, wherein the plurality of light permeable electrode layers include:

a first light permeable electrode layer disposed in contact with the exposed second conductive semiconductor layer; and a second light permeable electrode layer disposed under the first light permeable electrode layer and under the first insulating layer to separate the first insulating layer from the reflective layer.

19. The light emitting device of claim 18, wherein a thickness of the first light permeable electrode layer is smaller than a thickness of the first insulating layer.

20. The light emitting device of claim 18, wherein at least portions of the second light permeable electrode layer, the first insulating layer, and the reflective layer overlap with each other in the thickness direction of the light emitting structure.

* * * * *